United States Patent [19]
Yamauchi

[11] Patent Number: 6,009,011
[45] Date of Patent: Dec. 28, 1999

[54] NON-VOLATILE MEMORY AND METHOD FOR OPERATING THE SAME

[75] Inventor: Yoshimitsu Yamauchi, Nabari, Japan

[73] Assignee: Sharp Kabushiki Kaisha, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/997,909

[22] Filed: Dec. 24, 1997

[30] Foreign Application Priority Data

Dec. 27, 1996 [JP] Japan .................................... 8-351268

[51] Int. Cl.$^6$ .................................................. G11C 16/04
[52] U.S. Cl. ............................... 365/185.01; 365/185.08; 365/185.28
[58] Field of Search ............................... 365/185.01, 149, 365/185.28, 104, 185.16, 185.24, 185.27, 185.08; 275/108

[56] References Cited

U.S. PATENT DOCUMENTS 5,627,392  5/1997  Diorio et al. ........................... 257/315
5,640,345  6/1997  Okuda et al. ........................... 365/184
5,814,850  9/1998  Iwasa ....................................... 257/296

FOREIGN PATENT DOCUMENTS 2-240960  9/1990  Japan .
6-5801    1/1994  Japan .
6-244384  9/1994  Japan .

*Primary Examiner*—Trong Phan
*Assistant Examiner*—Thong Le
*Attorney, Agent, or Firm*—David G. Conlin; Richard E. Gamache

[57] ABSTRACT

A non-volatile memory includes: at least one memory cell including one non-volatile memory transistor and one capacitor; the non-volatile memory transistor being composed of a first dielectric film, a floating gate, a second dielectric film and a control gate sequentially laminated on a semiconductor substrate, and source/drain diffusion layers formed in the semiconductor substrate; the capacitor being composed of a capacitor dielectric film sandwiched between two electrodes, one of the electrodes being connected to the source diffusion layer of the non-volatile memory transistor; and an injecting/drawing means for injecting/drawing electrons from the drain diffusion layer to the floating gate by use of a tunnel current.

31 Claims, 16 Drawing Sheets

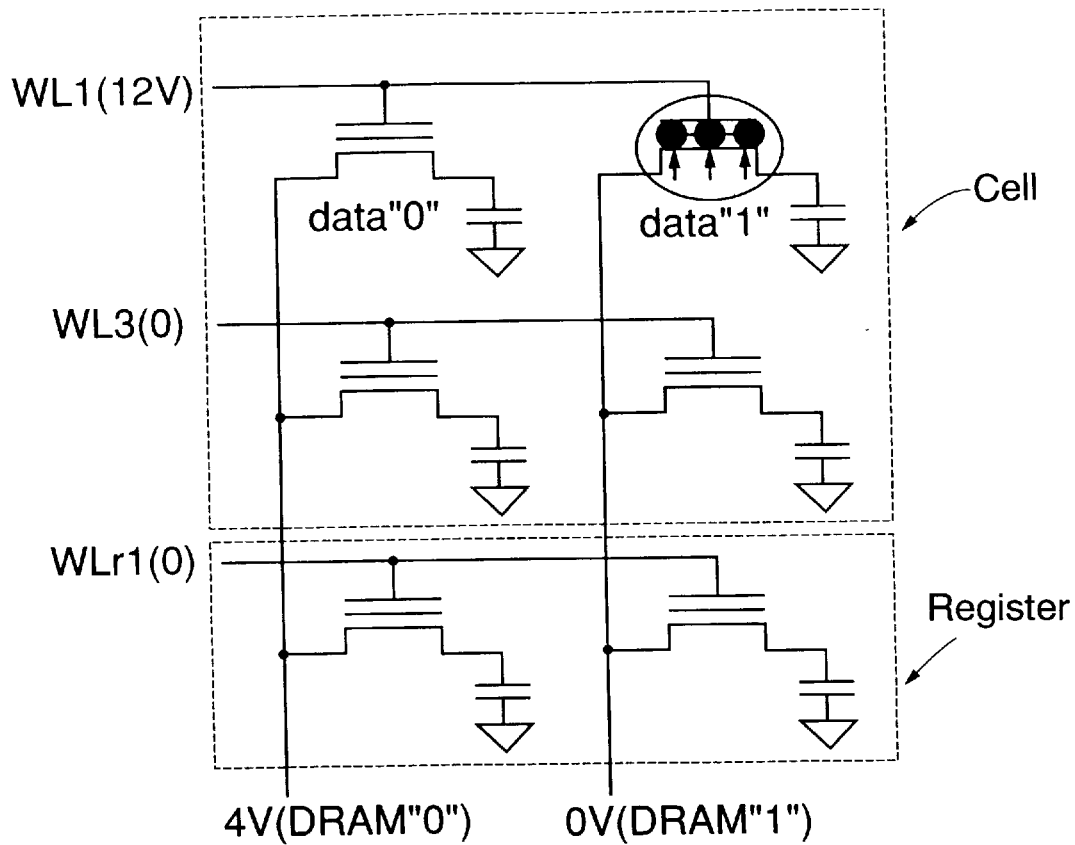

NON-VOLATILE MEMORY AND METHOD FOR OPERATING THE SAME

CROSS-REFERENCES TO RELATED APPLICATIONS

This application is related to Japanese Patent Application No. HEI 08-351268 filed on Dec. 27, 1996 whose priority is claimed under 35 USC §119, the disclosure of which is incorporated herein by reference in its entirety.

BACKGROUND OF THE INVENTION

1. Field of the Invention

The present invention is related to a non-volatile memory and, more particularly to a non-volatile memory having a function of dynamic RAM and a function of EEPROM.

2. Description of the Related Arts

Generally, semiconductor memory devices include a non-volatile memory (such as EEPROM) in which stored contents are retained after a power supply is turned off and a volatile memory (such as RAM) in which stored contents disappear when the power supply is turned off. EEPROM of a non-volatile memory can store data for a long time even after a power supply is turned off, but it is not suitable for frequently rewriting the data because it takes a lot of time for writing/erasing the data and the number of writing/erasing times is limited. On the other hand, RAM of a volatile memory takes only a short time for rewriting data and has no limitation to the number of rewriting times, but lets the stored data disappear when a power supply is turned off.

Therefore, as a semiconductor memory capable of rewriting the data frequently and retaining the rewritten data for a long time, there has been proposed a non-volatile RAM (NVRAM) which is a combination of EEPROM cells and RAM cells.

For example, Japanese Unexamined Patent Publication (Kokai) No. HEI 2(1990)-240960 discloses a semiconductor device in which EEPROM and DRAM are combined as NVRAM cells.

This semiconductor device is made up of a plurality of cells, each cell including a DRAM portion and an EEPROM portion. As shown in a cell circuit diagram of FIG. 18 and a cross-sectional cell structure of FIG. 19, a DRAM portion includes one MOS transistor (hereafter referred to as transistor T) and one capacitor C having a stack structure. The EEPROM portion includes one FLOTOX-type MOS transistor (hereafter referred to as transistor MT) on a semiconductor substrate.

In the transistor T, a word line is connected to a gate electrode 27, and a bit line is connected to a drain diffusion layer 21. The capacitor C has a stack structure in which a dielectric film 29 is sandwiched between a plate capacitor electrode 26 and a storage node (control gate) 25. The storage node 25 is connected to a source diffusion layer 23 of the transistor T. The transistor MT includes a floating gate 24 for storing the data for a long time, a tunnel dielectric film 28 disposed between the floating gate 24 and the source diffusion layer 22, and also includes the above-mentioned control gate 25. The drain diffusion layer of the transistor MT is connected to the source diffusion layer 23 of the transistor T.

The operation of a conventional semiconductor device constructed as a combination of EEPROM cells and DRAM cells in the manner shown above is as follows. In frequently rewriting data, the device is operated as a DRAM (DRAM operation). When a power supply is to be turned off or the data need to be stored for a long time, the data are transferred from a DRAM portion to an EEPROM portion in a lump to be stored in the EEPROM portion (storing operation). When the power supply is turned on, the data stored in the EEPROM portion are transferred back and stored in the DRAM portion (recalling operation).

However, this semiconductor device is accompanied by a drawback that, since it is made of DRAM portions and EEPROM portions, it is difficult to reduce the area on the semiconductor substrate occupied by the semiconductor device due to the requirement of area occupied by each portion, rendering the device unsuitable for large scale integration.

Also, Japanese Unexamined Patent Publication (Kokai) No. HEI 6(1994)-244384, for example, discloses a composite memory cell which is a combination of DRAM cells and non-volatile memory cells as NVRAM cells.

The composite memory cell is constructed as shown in a cell circuit diagram of FIG. 20 and a cross-sectional cell structure of FIG. 21. On one side of a substrate 35 for forming elements, there are formed a non-volatile memory cell including a floating gate 30 and a control gate 31 and data storage portions 32, 33, 34 of the DRAM cell. Above these cells, a support substrate 38 is bonded. On the other side of the substrate 35, there are formed a gate electrode 37, a channel region 36A and source/drain regions 36B constituting the DRAM cell.

This composite memory cell has an advantage that the occupied area of the substrate can be reduced compared with the above mentioned semiconductor device because gate regions of the DRAM cell and the non-volatile memory are stacked in a vertical direction with the channel region disposed therebetween. However, this composite memory cell is accompanied by a drawback that the structure and the manufacturing process are complicated because it requires a step of bonding a support substrate 38 above the non-volatile memory cell and the data storage portions of the DRAM cell and a step of removing a part of the substrate 35 for forming elements.

Further, Japanese Unexamined Patent Publication No. HEI 6(1994)-5801, for example, discloses a one-transistor non-volatile DRAM. This memory has a structure shown in a circuit diagram of FIG. 22 and a cross-sectional structure of FIG. 23. As shown, the memory includes a capacitor C and a transfer transistor TT formed in a semiconductor substrate 41. The capacitor C includes a storage node 42, a dielectric film 43 and an upper electrode 44. The transfer transistor T includes a source 45, a drain common to the storage node 42, a control gate 46 and floating gate 47a, 47b formed in a two-layer structure.

In this memory, data stored in the capacitor are transferred to the floating gate 47b by allowing electrons to pass by tunnel current between the floating gate 47b near the semiconductor substrate 41 and the storage node (drain) 42 of the capacitor C.

Specifically, in order to transfer the data from the capacitor C to the floating gate 47b, a voltage of +15V is applied to all word lines WL, and all bit lines BL are grounded. If a storage state in the capacitor C is data −"1" corresponding to a voltage of −5V of the capacitor C, electrons pass by tunnel current from the drain 42 to the floating gate 47b via tunnel oxide because an electric field in the transfer transistor TT near the capacitor C is sufficiently high. Since a capacitance of the capacitor C is extremely higher than that of the control gate 46, it is sufficient to charge the floating gate 47b into negative voltage. Thus, the voltage of −5V stored in the capacitor C is transferred to the floating gate 47b. On the other hand, if a voltage of the capacitor C is 0V indicating data "0", an electric field in the interlayer dielectric film is not sufficiently strong to allow electrons to pass by tunnel current into the floating gate 47b. As a result, the electrons are not injected into the floating gate 47b, keeping the floating gate 47b uncharged. Accordingly, the data stored in the capacitor C during a previous DRAM mode operation are transferred perpetually into the floating gate 47b and remain there until a power is restored and a recalling/erasing mode is activated (non-volatile storage). Thus, since a voltage of 15V is applied to the word line WL, the transfer transistor T is in an OFF-state and a channel layer is not formed.

Generally, writing characteristics of a non-volatile memory is determined by a potential difference between source/drain regions and a word line. However, in the case of the above memory cell, positive holes are generated in the drain 42 as a result of injection of electrons into the floating gate 47b. Moreover, since the drain 42 is in a floating state, the positive holes are accumulated in the drain 42. Therefore, the potential of the drain 42 decreases, so that the potential difference between the drain 42 and the word line WL grows smaller in accordance with the writing operation. As a result, there arises a problem that the writing characteristics vary widely.

At the time of erasing, a voltage of −20V is applied to a selected word line WL and a voltage of 0V is applied to all bit lines BL to erase data stored in the floating gate 47. This allows the electrons to pass by tunnel current into the drain 42 to remove the electrons remaining in the floating gate 47. Thus, since the voltage of −20V is applied to the word line WL, the transfer transistor TT is in an ON-state. The electrons in the floating gate 47 are drawn into the drain 42 by the potential difference between the drain 42 and the word line WL provided by supplying to the drain 42 via the channel layer the voltage applied to the bit line BL in which a channel region is formed. Here, since a tunnel oxide film is formed only on a drain side, the electrons are drawn into the drain. As a result, there arises a problem that, since a drain voltage decreases due to "ON" resistance, a source voltage must be raised by an amount corresponding to the "ON" resistance.

SUMMARY OF THE INVENTION

The present invention has been made in view of the above circumstances and provides a non-volatile memory which can be achieved with approximately the same occupied area as the conventional DRAM cells and with a comparatively simple structure and manufacturing process and which can reduce the variation in the writing characteristics, and a method for operating the same.

The present invention provides a non-volatile memory comprising: at least one memory cell including one non-volatile memory transistor and one capacitor; the non-volatile memory transistor being composed of a first dielectric film, a floating gate, a second dielectric film and a control gate sequentially laminated on a semiconductor substrate, and source/drain diffusion layers formed in the semiconductor substrate; the capacitor being composed of a capacitor dielectric film sandwiched between two electrodes, one of the electrodes being connected to the source diffusion layer of the non-volatile memory transistor; and an injecting/drawing means for injecting/drawing electrons from the drain diffusion layer to the floating gate by use of a tunnel current.

Also, the present invention provides a method of operating the non-volatile memory in the form having a plurality of memory cells arranged in a matrix configuration, a word line connected to the control gate of the non-volatile memory transistor, and a bit line connected to the drain diffusion layer of the non-volatile memory transistor, each capacitor having a predetermined data stored therein, in which a storing operation for controlling a threshold voltage of the non-volatile memory transistor comprises:

A) applying a second voltage to the bit line using the electron injecting/drawing means to create a second potential difference for generating a tunnel current between the floating gate and at least the drain diffusion layer only when the data stored in the capacitor is a second data; and applying a first voltage to the bit line for inhibiting the generation of the tunnel current using the electron injecting/drawing means to create a first potential difference, which is smaller than the second potential difference, between the floating gate and at least the drain diffusion layer when the data stored in the capacitor is a first data;

B) latching the data stored in each capacitor; creating a potential difference to generate a tunnel current between the floating gate and at least the drain diffusion layer using the electron injecting/drawing means irrespective of the data stored in the capacitor to inject/draw electrons; applying a first voltage to the bit line using the electron injecting/drawing means to create a second potential difference for generating a tunnel current between the floating gate and at least the drain diffusion layer to draw/inject electrons only when the latched data is a first data; and applying a second voltage to the bit line for inhibiting the generation of the tunnel current using the electron injecting/drawing means to create a first potential difference, which is smaller than the second potential difference, between the floating gate and at least the drain diffusion layer when the latched data is a second data;

C) applying to the word line a voltage Vw1 between a threshold voltage of the transistor having the first data stored therein and a threshold voltage of the transistor having the second data stored therein and applying a predetermined voltage Vb1 to the bit line to write a voltage Vb1 only into the capacitor of the transistor turned on; applying the voltage Vw1 to the word line, applying to the bit line a voltage Vb2 which is different from the voltage Vb1, detecting a change in the voltage Vb2 on the bit line, verifying the data to be the first data when the detected voltage is not coincident with the voltage Vb2 and verifying the data to be the second data when the detected voltage is coincident with the voltage Vb2, and latching the data; allowing the threshold voltages of all the non-volatile memory transistors to be uniform by applying a first voltage to the bit line using the electron injecting/drawing means to create a second potential difference for generating a tunnel current between the floating gate and at least the drain diffusion layer only when the second data is stored in the transistor, and by applying a second voltage to the bit line for inhibiting the generation of the tunnel current using the electron injecting/drawing means to create a first potential difference, which is smaller than the second potential difference, between the floating gate and at least the drain diffusion layer when the threshold voltage of the transistor corresponds to the first data; and storing the latched first and second data respectively into the capacitors; or D) applying to the word line a voltage Vw1 between a threshold voltage of the transistor having the first data stored therein and a threshold voltage of the transistor having the second data stored therein and applying a predetermined voltage Vb1 to the bit line to write a voltage Vb1 only into the capacitor of the transistor turned on; applying the voltage Vw1 to the word line, applying to the bit line a voltage Vb2 which is different from the voltage Vb1, detecting a change in the voltage Vb2 on the bit line, verifying the data to be the first data when the detected voltage is not coincident with the voltage Vb2 and verifying the data to be the second data when the detected voltage is coincident with the voltage Vb2, and latching the data; applying a second voltage to the bit line using the electron injecting/drawing means to create a potential difference for generating a tunnel current between the floating gate and at least the drain diffusion layer for injecting/drawing the electrons to allow the threshold voltages of all the transistors connected to a selected word line to be higher than the threshold voltage of the transistor having the first data stored therein irrespective of the latched data; applying a first voltage to the bit line using the electron injecting/drawing means to create a potential difference for generating a tunnel current between the floating gate and at least the drain diffusion layer for injecting/drawing the electrons to allow the threshold voltages of all the transistors connected to the selected word line to be uniform; and storing the latched first and second data respectively into the capacitors.

BRIEF DESCRIPTION OF THE DRAWINGS

The present invention will be better understood from the following detailed description of preferred embodiments of the invention, taken in conjunction with the accompanying drawings, in which:

FIG. 7 is a view showing an equivalent circuit for explaining one storage operation in the non-volatile memory of the present invention;

DETAILED DESCRIPTION OF THE PREFERRED EMBODIMENTS

Figure 1C:
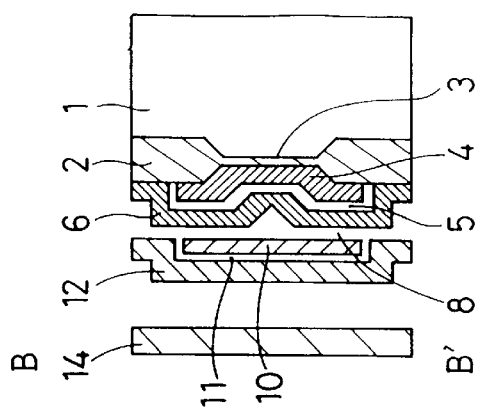
FIG. 1(c) is a schematic lateral cross-sectional view of the essential part of the non-volatile memory of FIG. 1(a)

The non-volatile memory of the present invention basically includes at least one unit memory cell having one non-volatile memory transistor and one capacitor, and includes an injecting/drawing means for injecting/drawing electrons from a drain diffusion layer to a floating gate of the non-volatile memory transistor (hereafter referred to as "injecting/drawing means"). Preferably, a plurality of unit memory cells are arranged in a matrix configuration. The drain diffusion layer of the non-volatile transistor of each memory cell is connected to a bit line, and the control gate is connected to a word line.

The non-volatile memory transistor includes a first dielectric film, a floating gate, a second dielectric film, and a control gate sequentially laminated on a semiconductor substrate and source/drain diffusion layer formed in the semiconductor layer.

The first dielectric film is what is generally called a "tunnel dielectric film" and may be formed of silicon oxide film or nitrogen-containing silicon oxide film. The thickness of the first dielectric film may be adjusted in accordance with applied voltage in operating such a transistor.

The floating gate is preferably formed of a material, such as polysilicon or a silicon nitride film, capable of suitably storing an electric charge. The thickness of the floating gate is not specifically limited. In the present invention, the floating gate functions as an electric charge storing layer for storing an electric charge. The floating gate may be, in addition to the above, a layer having a large number of traps such as a two-layer structure of $SiN$—$SiO_2$ or a three-layer structure of $SiO_2$—$SiN$—$SiO_2$.

The second dielectric film is formed between the floating gate and the later-mentioned control gate. The second dielectric film may be formed of the same material as the first dielectric film.

The material for the control gate is not specifically limited as long as it is a material that can generally be used for an electrode. The control gate may be formed of polysilicon, silicide, polycide, various kinds of metals and the like to any thickness. It is preferably formed to cover the entire surface or a part of the surface of the floating gate so as to control the injection of electrons into the floating gate.

The source/drain diffusion layers contain a P-type impurity or an N-type impurity. The source/drain diffusion layers are preferably formed symmetrically and with the same impurity concentration in view of facilitating the manufacturing process. However, in order to facilitate the injection/drawing of electrons from the drain diffusion layer to the floating gate of the non-volatile memory transistor by using the later-mentioned injecting/drawing means, the impurity concentration in the drain diffusion layer may be higher than that in the source diffusion layer, or the source diffusion layer and the drain diffusion layer may be formed asymmetrically with respect to the floating gate.

Also, in the non-volatile memory cell transistor, the first dielectric film may be formed to have a non-uniform thickness so that the first dielectric film has a smaller thickness near the drain diffusion layer than near the source diffusion layer in order to facilitate the inject ion/drawing of electrons from the drain diffusion layer to the floating gate of the non-volatile memory transistor by using the injecting/drawing means.

The non-volatile memory transistor of the present invention may be formed either as an N-type transistor or as a P-type transistor.

The capacitor is constructed in such a manner that a capacitor dielectric film is sandwiched between two electrodes, for example, a storage electrode and a plate electrode.

The material for the capacitor dielectric film is not specifically limited and may be, for example, silicon oxide film, silicon nitride film, or a laminated film thereof, which is formed to any thickness.

The material for the storing electrode is not specifically limited as long as it is a material capable of being used as an electrode. The storing electrode may be formed to have any thickness, and is electrically connected to the source diffusion layer of the non-volatile memory transistor. Alternatively, the storing electrode, however, may be formed integrally with the source diffusion layer as a diffusion layer formed in the semiconductor substrate.

The plate electrode may be formed of the same material as the storing electrode and may have any thickness. Although the plate electrode may be formed in correspondence with each memory cell, the plate electrode of one memory cell is preferably formed integrally with plate electrodes of a plurality of adjacent memory cells.

Figure 17:
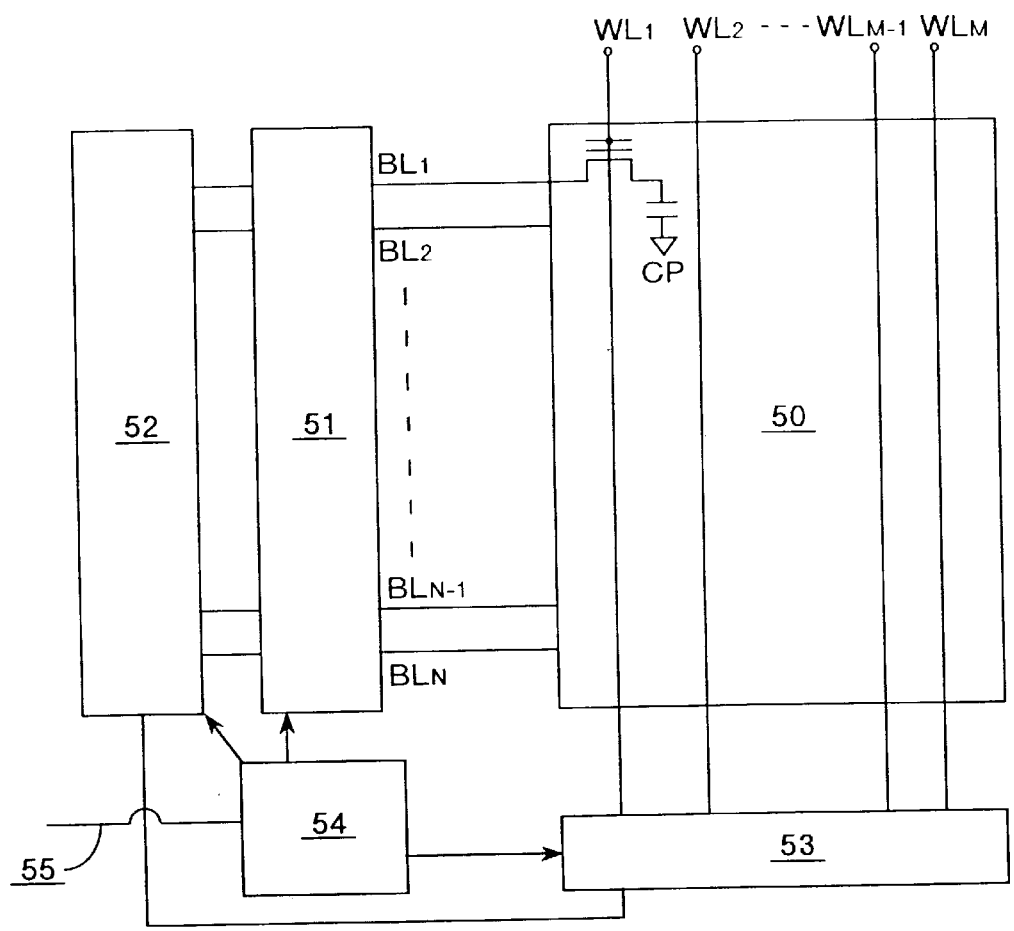
FIG. 17 is a schematic view for explaining a memory system including a means for injecting/drawing electrons in the non-volatile memory of the present invention.
Figure 18:
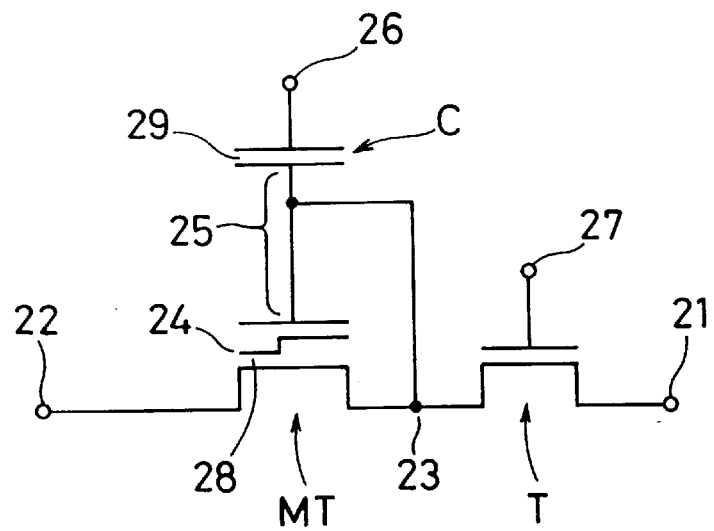
FIG. 18 is a view showing an equivalent circuit of an example of a conventional NVRAM cell.
Figure 19:
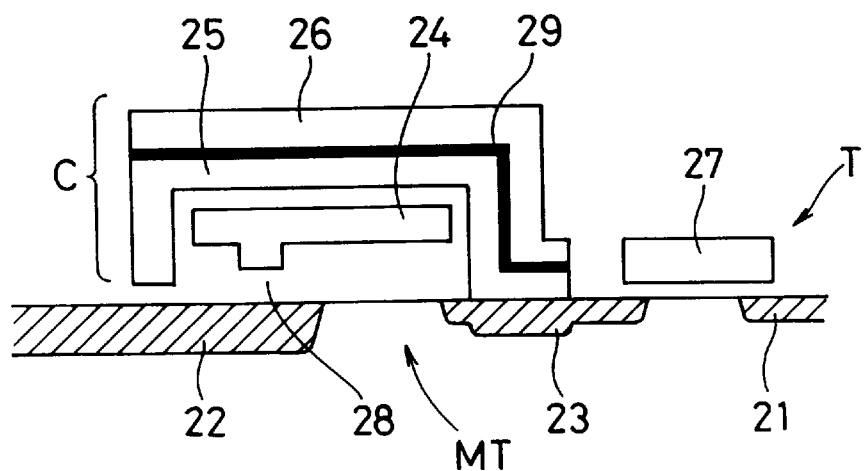
FIG. 19 is a schematic cross-sectional view of the NVRAM cell of FIG. 18.
Figure 20:
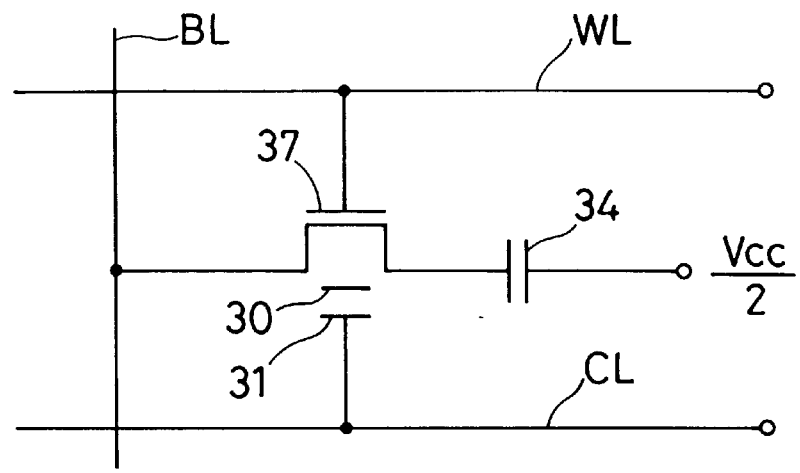
FIG. 20 is a view showing an equivalent circuit of another example of a conventional NVRAM cell.
Figure 21:
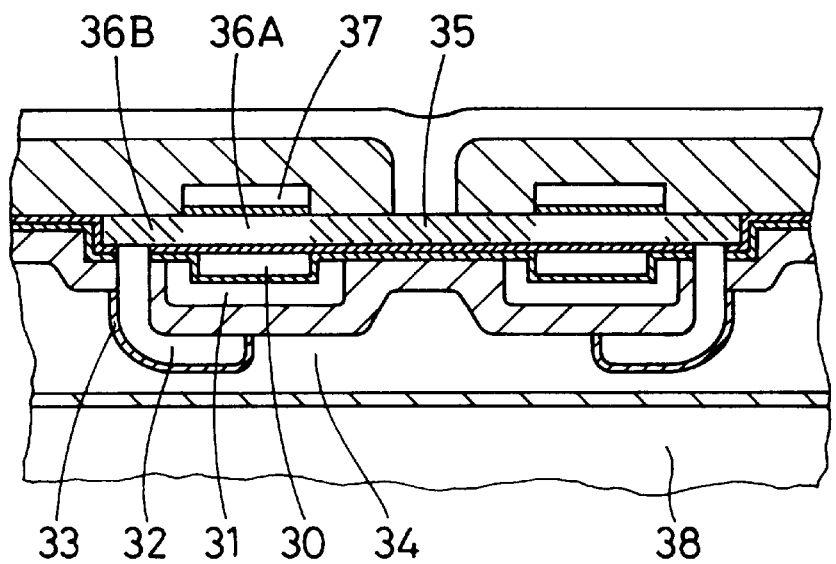
FIG. 21 is a schematic cross-sectional view of the NVRAM cell of FIG. 20.
Figure 22:
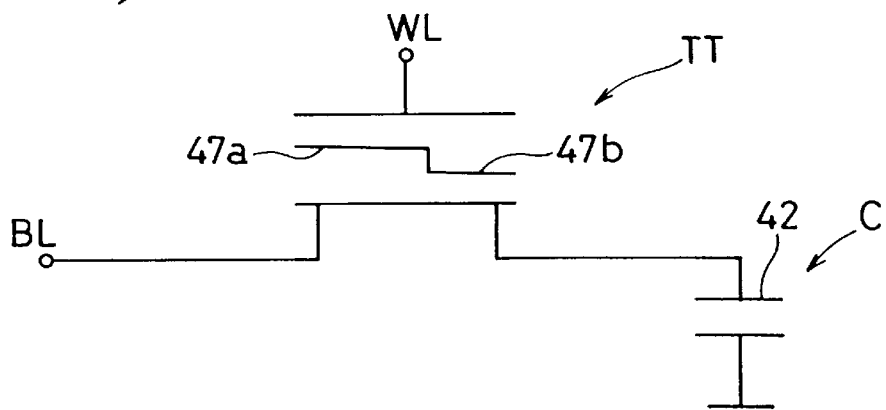
FIG. 22 is a view showing an equivalent circuit of still another example of a conventional NVRAM cell.
Figure 23:
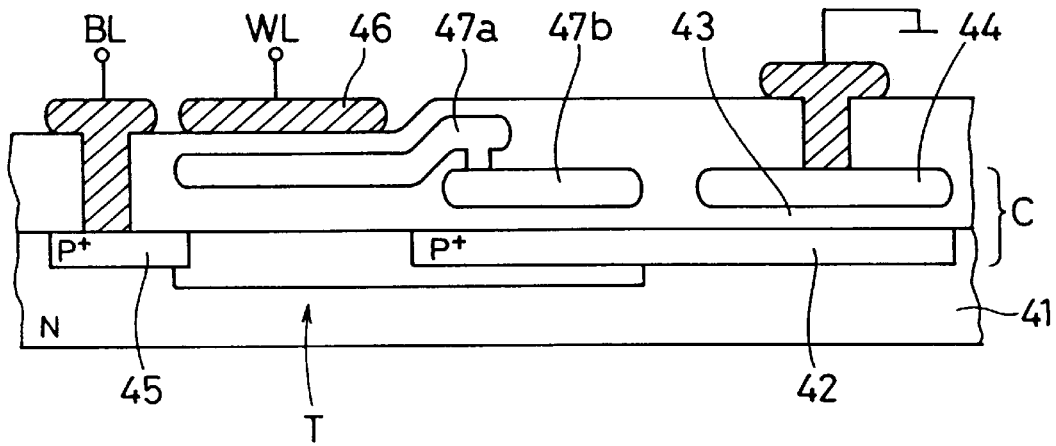
FIG. 23 is a schematic cross-sectional view of the NVRAM cell of FIG. 22.

The non-volatile memory including the injecting/drawing means according to the present invention can be achieved by a memory system as shown in FIG. 17. In other words, the non-volatile memory may be formed of a memory cell array 50, a bit line decoder, precharge, sense amplifier and latching circuit 51, a multiplexer 52, a word line decoder and driving circuit 53, a timing circuit 54 and the like. The bit line decoder, precharge, sense amplifier and latching circuit 51, the multiplexer 52, the word line decoder and driving circuit 53, and the timing circuit 54 may be formed of known circuits. Each word line WL to which the control gate is connected in the memory cell array 50 is connected to the word line decoder and driving circuit 53. Each bit line BL is connected to the bit line decoder, precharge, sense amplifier and latching circuit 51. In order to select a specific memory cell in the memory cell array 50, the multiplexer 52 is connected to the bit line decoder 51 and the word line decoder 53. The data is input and output through the multiplexer 52. Also, the timing circuit 54, which is operated in accordance with the present invention and into which a stopping signal 55 is input is connected to the multiplexer 52, the bit line decoder 51, and the word line decoder 53.

The injection/drawing of electrons into the floating gate from the drain diffusion layer is intended to mean injection/drawing of electrons between the floating gate and at least the drain diffusion layer. For example, if the non-volatile memory transistor is in an "ON" state, a channel is formed in a surface of the semiconductor substrate immediately under the floating gate, so that electrons are injected/drawn also from this channel into the floating gate. Therefore, the above-mentioned injection/drawing of electrons is also intended to include the injection/drawing of electrons into the floating electrode from the drain diffusion layer and a portion or all of the channel region, or from the entire surface area extending from the drain diffusion layer to the source diffusion layer.

The non-volatile memory of the present invention may be manufactured by suitably modifying a known transistor manufacturing method. In other words, the manufacturing of the non-volatile memory according to the present invention is achieved by a suitable combination of desired thin film forming technique, thin film processing technique, diffusion layer forming technique, wiring forming technique and the like.

Figure 4:
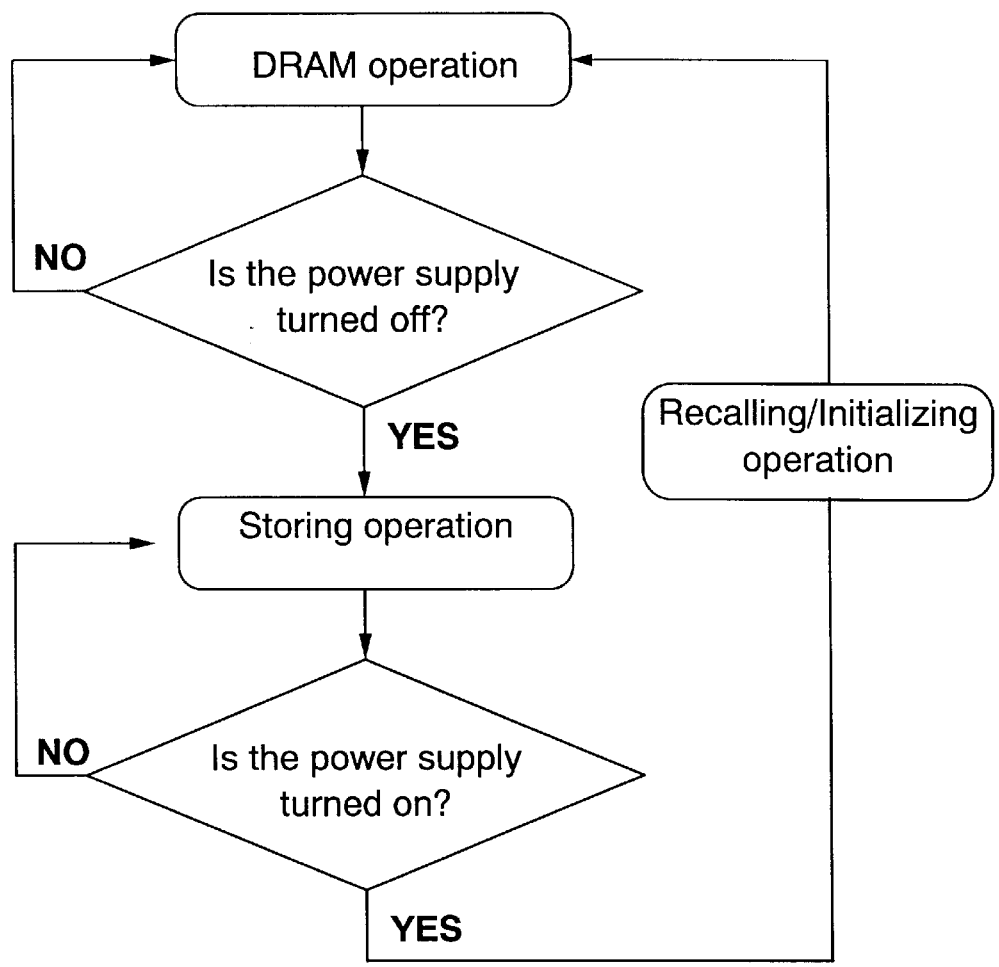
FIG. 4 is a flowchart showing an embodiment of the operation of the non-volatile memory according to the present invention.

The non-volatile memory of the present invention functions as a semiconductor device capable of rewriting the data at a high speed as well as retaining the rewritten data for a long time by principal operations such as DRAM operation, storing operation and recalling/initializing operation, as shown in the flowchart of FIG. 4. These operations are explained in detail in the following description of the preferred embodiments. However, the voltages to be applied to the bit line, the word line, the plate electrode and the like are not specifically limited. In the following description of the preferred embodiments, appropriate values of the voltages are given for exemplifying purposes in accordance with the DRAM operation when the non-volatile memory is operated as a DRAM. These values may be suitably chosen depending on the parameters such as the function of each element, the optimization of DRAM operation, the power supply voltage and the like. Appropriate selection of voltages may be made for the storing operation and the recalling/initializing operation as well.

The storing operation in the non-volatile memory of the present invention is performed so that the data in the capacitor is stored into the non-volatile memory transistor when the power is to be turned off, when a power failure is detected, when a sudden change in the power supply voltage is detected or the like.

There are two kinds of storing operations. According to one storing operation, the threshold voltage of the non-volatile memory transistor is changed by creating a first potential difference between the word line and the drain diffusion layer or by creating a second potential difference, which is smaller than the first potential difference, between the word line and the drain diffusion layer using the injecting means in accordance with a first data (for example, "0") or a second data (for example, "1") stored in the capacitor after the data stored in the capacitor is identified.

Here, the first potential difference is such that a tunnel current is generated between the gate and the drain diffusion layer, whereas the second potential difference is such that the tunnel current is not generated. The first and second potential differences may be suitably adjusted by changing the thickness of the tunnel oxide film and the impurity concentration of the drain diffusion layer.

The voltage of 12V applied to the word line allows the non-volatile memory to be in an "ON" state, whereby electron are injected by tunnel current not only between the floating gate and the drain diffusion layer but also between the floating gate and the entire substrate.

The above storing operation is performed by injection of electrons into the floating gate. Alternatively, however, the storing operation can be performed by drawing electrons from the floating gate. In the latter case, a voltage of −8V is applied to the word line and a voltage of 4V is applied to the bit line, allowing the non-volatile memory to be in an "OFF" state, whereby electrons are drawn by tunnel current only between the floating gate and the drain diffusion layer.

According to the other storing operation, the data in the capacitor is latched and a tunnel current is generated between the selected word line and the drain diffusion layer by using the injecting (drawing) means irrespective of the first and second data. The threshold voltage of the non-volatile memory transistor is then changed by drawing (injecting) electrons by using the drawing (injecting) means in accordance with the latched data.

The recalling/initializing operation for the non-volatile memory of the present invention is an operation such that the electric charge stored in the floating gate of the non-volatile memory transistor is transferred to the capacitor when the power supply is on. For that purpose, a series of operations including writing, reading (verifying), latching, initializing, transferring and the like are performed.

First, by utilizing the threshold voltages varying in accordance with the first data (for example, "0") or the second data (for example, "1") stored in the floating gate, the writing and reading (verifying) of the data is performed. At this time, the voltages Vb1 and Vb2 applied to the bit line may be the same as the voltages used in writing the data "0", and "1" in DRAM operation.

Then, the read (verified) data is latched by a conventional method and stored in the latching circuit; the threshold voltages of the non-volatile memory transistors are made uniform (initialized) by drawing electrons using the drawing means in accordance with the data; and the latched data are transferred and written into the capacitor again.

Here, a voltage of −8V applied to the word line allows the non-volatile memory transistor to be in an "OFF" state, whereby electrons are drawn by tunnel current only between the floating gate and the drain diffusion layer.

Alternatively, after the data is stored in the latching circuit, the threshold voltages of the non-volatile memory transistors may be made uniform by injecting electrons using an electron injecting means and subsequently drawing electrons using an electron drawing means in all the non-volatile memory transistors connected to the selected word line. Here, the electron injecting means and the electron drawing means inject and draw electrons irrespective of the identified data.

The above-described recalling/initializing operation is carried out by drawing electrons from the floating gate. Alternatively, however, it may be carried out by injecting electrons into the floating gate. In this case, a voltage of 12V applied to the word line and a voltage of 0V applied to the bit line allow the non-volatile memory to be in an "ON" state, whereby electrons are injected by tunnel current not only between the floating gate and the drain diffusion layer but also between the floating gate and the entire substrate.

EXAMPLES

Hereafter, the embodiments of the non-volatile memory according to the present invention are described with reference to the attached drawings.

Figure 1A:
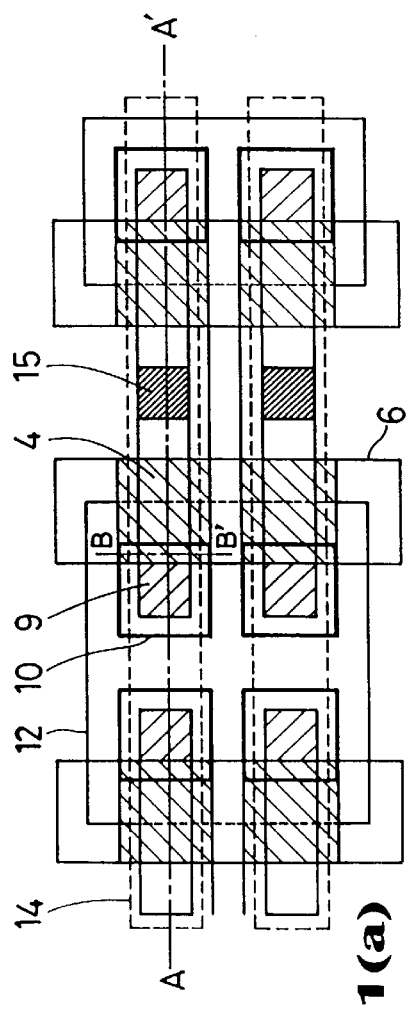
FIG. 1(a) is a plan view of a non-volatile memory according to an embodiment of the present invention.
Figure 1B:
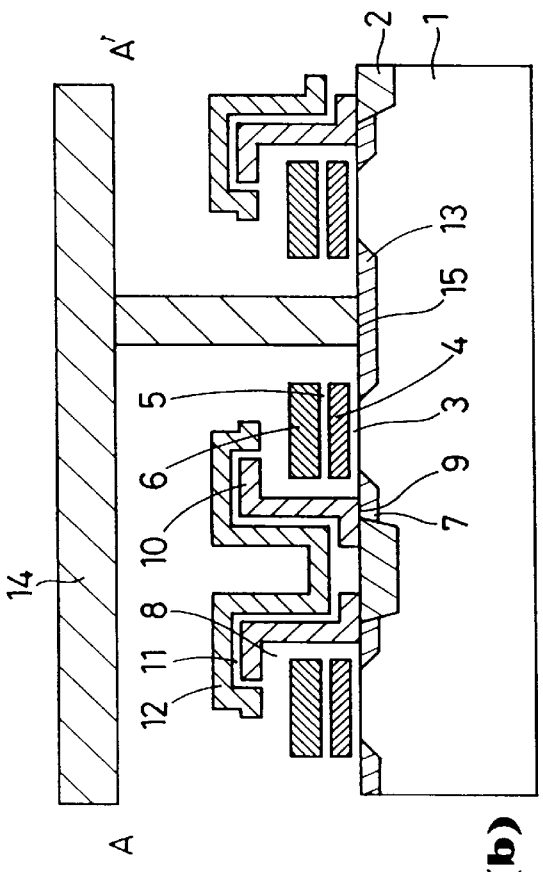
FIG. 1(b) is a schematic longitudinal cross-sectional view of an essential part of the non-volatile memory of FIG. 1(a)
Figure 2:
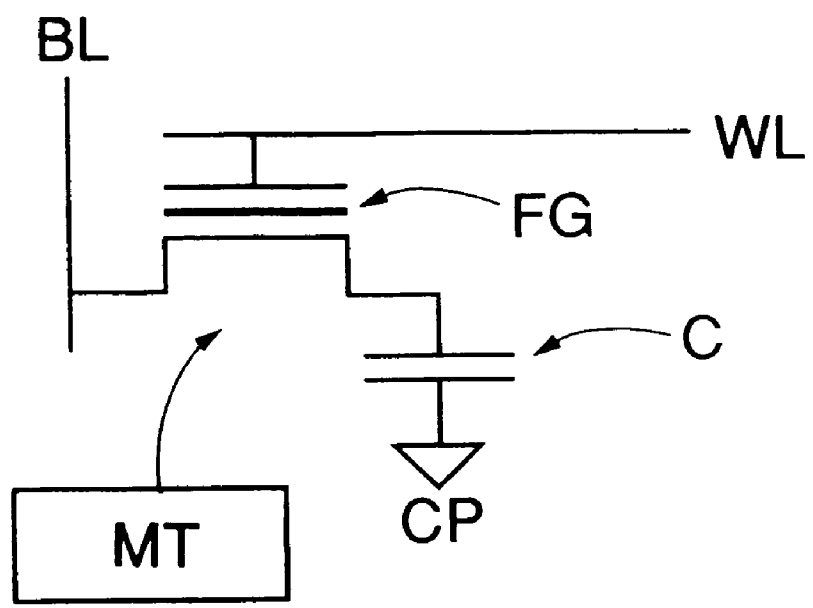
FIG. 2 is a view showing an equivalent circuit of the non-volatile memory illustrated in FIG. 1.

FIGS. 1(a) to 1(c) show views of a memory cell array of an open bit type using the non-volatile memory according to the present invention. FIG. 2 shows an equivalent circuit of one cell in FIG. 1. The non-volatile memory of the present invention is constructed in such a manner that a plurality of memory cells are arranged in a matrix configuration, as shown in FIGS. 1(a) to 1(c). FIG. 1(a) shows a plan view of the memory cell array; FIG. 1(b) shows a cross-sectional view of FIG. 1(a) along the A-A' line; and FIG. 1(c) shows a cross-sectional view of FIG. 1(a) along the B-B' line.

Each memory cell includes one non-volatile memory transistor (also serving as a transferring/selecting transistor of DRAM, hereafter referred to as "MT") and one capacitor C. Adjacent memory cells are separated by a LOCOS oxide film 2.

The memory transistor MT includes a floating gate 4 formed on a semiconductor substrate 1 via a tunnel dielectric film 3, which is a first dielectric film, and a control gate 6 (also serving as a gate electrode of DRAM) formed on the floating gate 4 via an ONO film 5 which is a second dielectric film. The control gate 6 is connected to a word line. The source diffusion layer 7 is surrounded by the LOCOS oxide film 2 cell by cell and is thus in a floating state. The drain diffusion layer 13 is connected to a bit line 14 via an aperture window 15.

The capacitor C is formed to have a stack structure including a storing electrode 10 of polysilicon made over the control gate 6 via a dielectric film 8, a dielectric film 11 of ONO film and a plate electrode 12, which are sequentially laminated. One terminal end of the storing electrode 10 is connected to the source diffusion layer 7 of the memory transistor MT by an ohmic contact via the aperture window 9, and the other terminal end of the storing electrode 10 extends over the control gate 6. The plate electrode 12 is formed as an electrode common to a plurality of memory cells (four memory cells in FIG. 1).

Figure 3C:
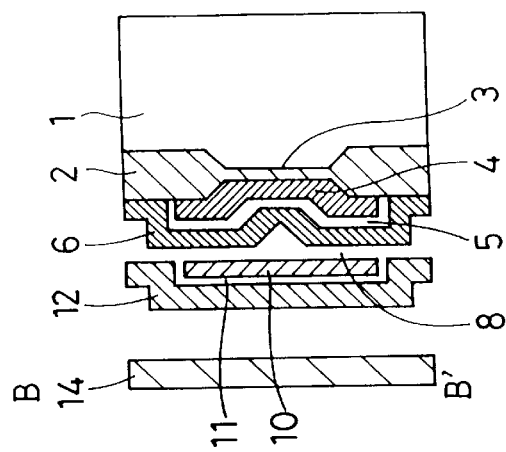
FIG. 3(c) is a schematic lateral cross-sectional view of the essential part of the non-volatile memory of FIG. 3(a)
Figure 3A:
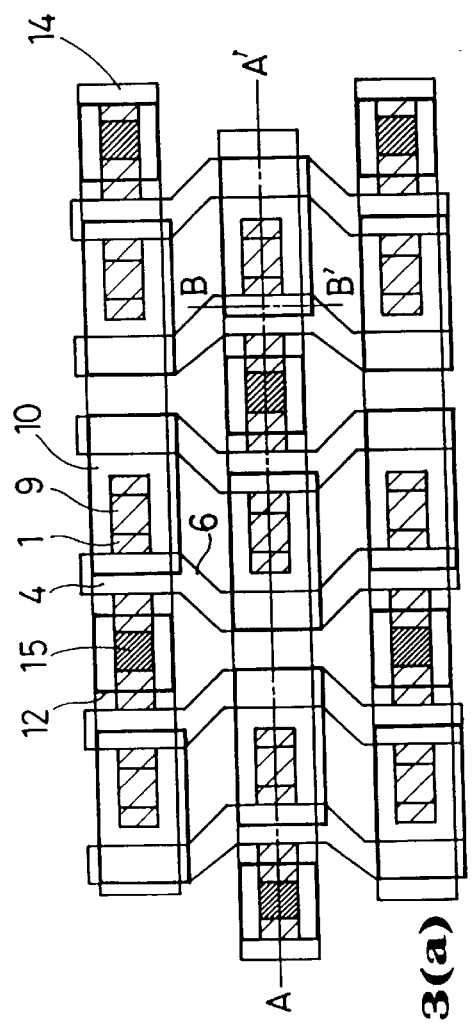
FIG. 3(a) is a plan view of a non-volatile memory according to another embodiment of the present invention.
Figure 3B:
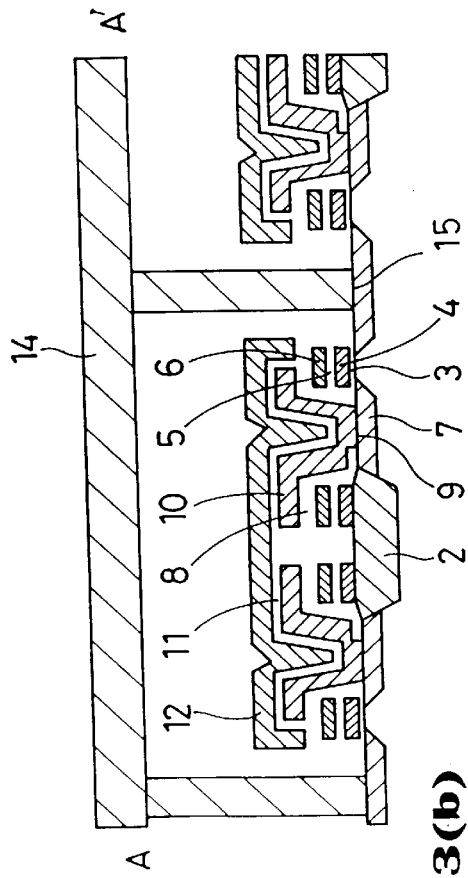
FIG. 3(b) is a schematic longitudinal cross-sectional view of an essential part of the non-volatile memory of FIG. 3(a)

Although a memory cell array of open bit type has been shown in FIG. 1, it is possible to use a memory cell array of folded bit type as shown in FIGS. 3(a) to 3(c) in the present invention. In FIGS. 3(a) to 3(c), like elements are represented by like numerals in FIGS. 1(a) to 1(c). In the construction shown above, the floating gate functions as an electric charge storing layer for storing an electric charge and may be formed of polysilicon or a layer having a lot of traps such as a two-layer structure of SiN—SiO$_2$ or a three-layer structure of SiO$_2$—SiN—SiO$_2$.

This non-volatile memory constructed as above is operated as shown in the flow chart of FIG. 4.

Figure 5A:
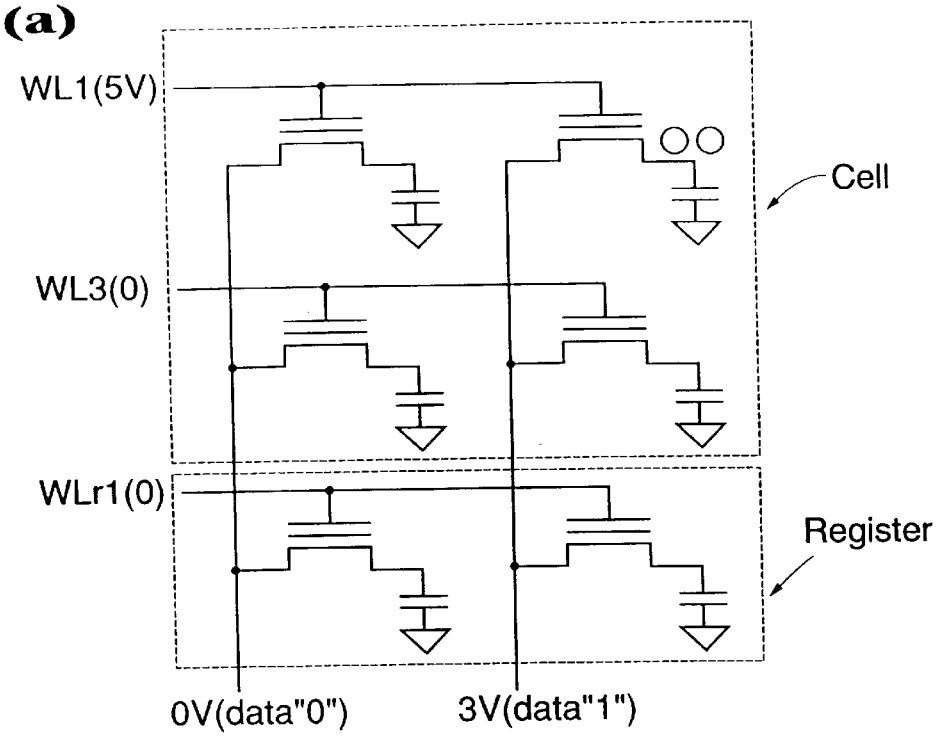
FIGS. 5(a) and 5(b) are views showing equivalent circuits for explaining a DRAM operation in the non-volatile memory according to the present invention.
Figure 5B:
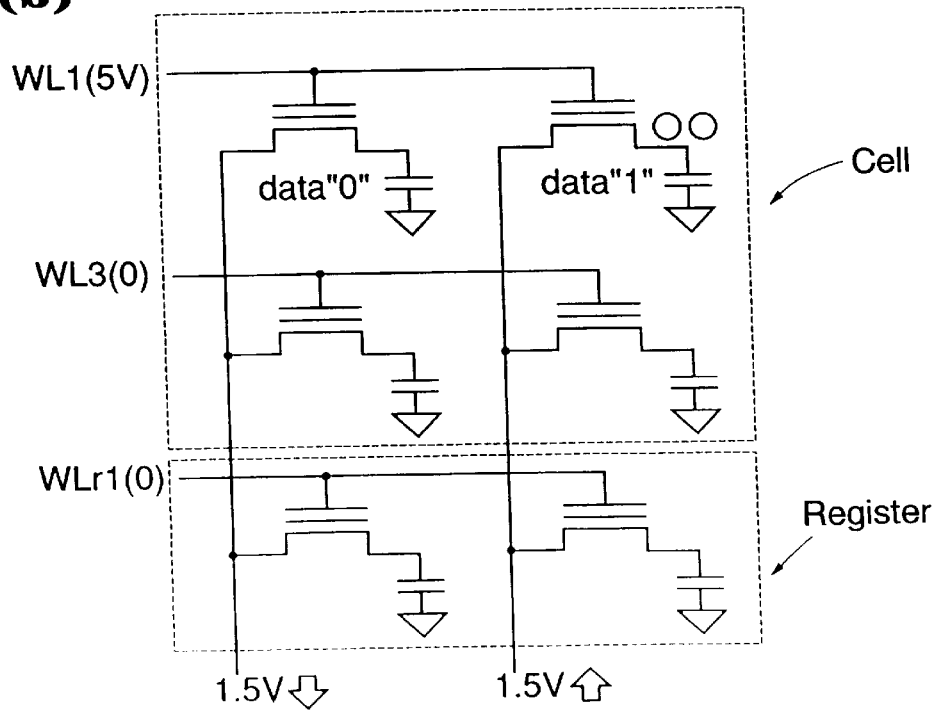

First, a DRAM operation (1) is carried out. The DRAM operation may be carried out in the same manner as in a conventional DRAM. For example, it can be carried out by using equivalent circuits shown in FIGS. 5(a) and 5(b) and applying a voltage as shown in Table 1.

TABLE 1

| | WL | | BL | | |
|---|---|---|---|---|---|
| mode | selected | non-selected | data "0" | data "1" | CP |
| DRAM | 5V | 0V | 0V | 3V | Vcc/2 |

In writing operation, electric charge is stored in the capacitor by applying a voltage of 5V to the word line connected to a cell into which the data is to be written, and by applying a voltage of 0V to a bit line when a data "0" is to be written and applying a voltage of 3V to a bit line when a data "1" is to be written. At this time, a voltage of V$_{cc}$/2 (V) is applied to the plate electrode (CP). A voltage of 0V applied to the word line connected to the non-selected memory cells allows the non-selected memory cells to be in an "OFF" state, whereby no data is written thereinto (See FIG. 5(a)).

In reading operation, the bit line is precharged to a voltage of V$_{cc}$/2 (1.5V in the case where V$_{cc}$ is 3V), and a voltage of 5V is applied to the word line of the selected memory cell to allow the memory cell to be in an "ON" state in the same manner as in the writing operation. At this time, the electric charge stored in the capacitor changes the electric potential of the bit line, whereby the data is read (verified) by comparing the changed electric potential of the bit line with the base potential (V$_{cc}$/2) (See FIG. 5(b)).

Figure 6A:
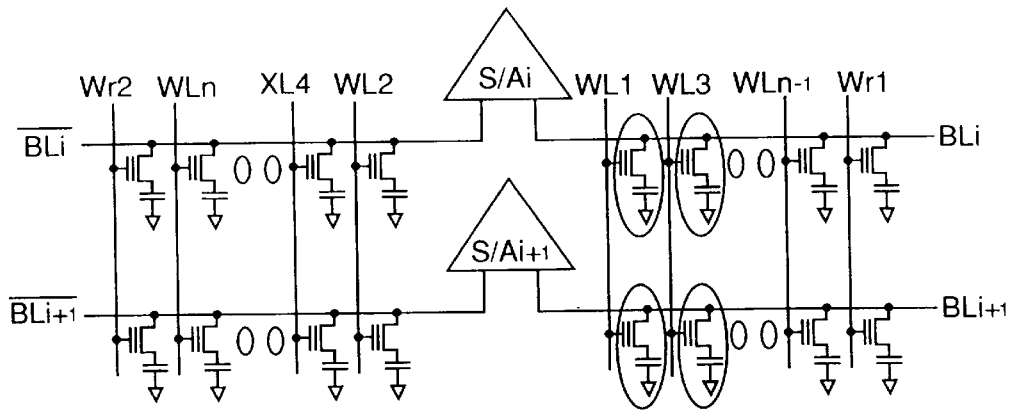
FIGS. 6(a) and 6(b) are views showing equivalent circuits of an open bit array and a folded array in reading operation using the non-volatile memory of the present invention.
Figure 6B:
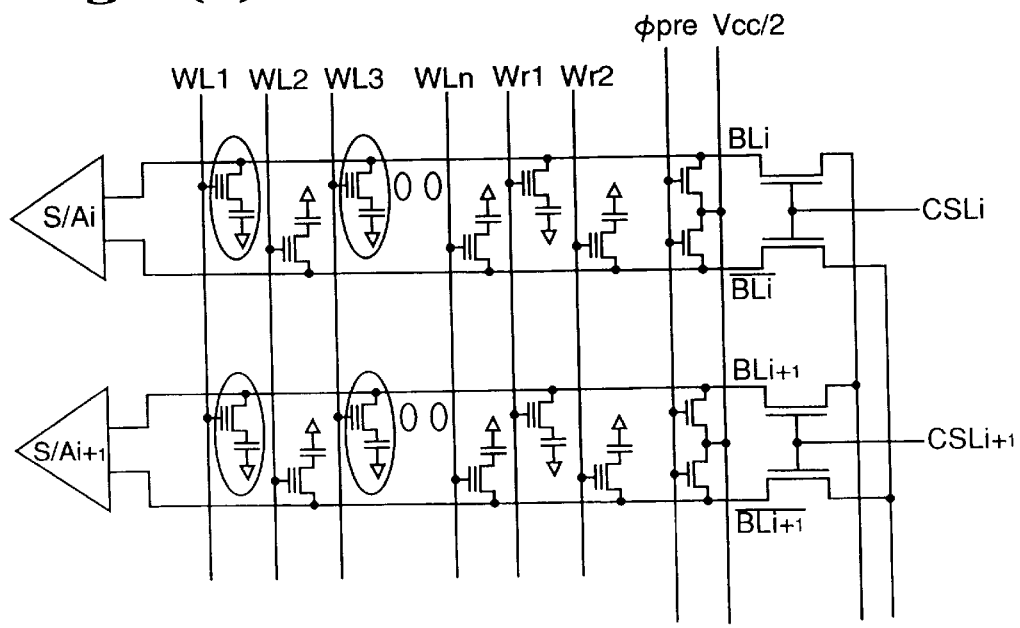

FIGS. 6(a) and 6(b) show equivalent circuits of the open bit array and the folded array in the reading operation.

Then, verification of whether the power supply is to be turned off is performed. If the power supply is to be turned off, a storing operation (2) is carried out. The storing operation is an operation in which the data written by the above-described DRAM operation (the electric charge stored in the capacitor) is transferred and stored into the floating gate of the memory transistor MT. There are two kinds of storing operations. One storing operation is carried out by using an equivalent circuit shown in FIG. 7 and applying a voltage shown in Table 2.

TABLE 2

| | WL | | BL | | |
|---|---|---|---|---|---|
| mode | selected | non-selected | data "0" | data "1" | CP |
| STORE | 12V | 0V | 4V | 0V | Vcc/2 |

First, the change in the electric potential of the bit line is detected in the same manner as in the ordinary DRAM operation to find whether the data stored in the capacitor is "0" (the state in which no electric charge is stored) or "1" (the state in which electric charge is stored). This verification is performed using a known method.

Then, a voltage of 4V is applied to the bit line at which the data has been verified to be "0", whereas a voltage of 0V is applied to the bit line at which the data has been verified to be "1". Since a voltage of 12V is applied to the selected word line, an electric potential difference of 12V is generated between the word line and the bit line if the data is verified to be "1", whereby electrons are injected by FN tunnel current from the drain diffusion layer into the floating gate of the memory transistor MT to raise the threshold voltage of MT. The injection of electrons is repeated until the threshold voltage reaches a predetermined value (for example 5.5V). The verification of whether the threshold voltage has reached 5.5V is carried out by applying a voltage of 5.5V to the word line. If the memory transistor MT is in the "ON" state, the injection of electrons is carried out again. This voltage of 5.5V is hereafter referred to as "HVth". On the other hand, if the data is verified to be "0", a potential difference of only 8V is generated between the word line and the bit line, whereby no electrons are injected into the floating gate of the memory transistor MT. Also, since a voltage of 0V is applied to the non-selected word line, no electrons are injected into the floating gate, whereby the threshold voltage of the memory transistor MT remain at a low value such as about 1 to 2V (LVth).

Figure 8:
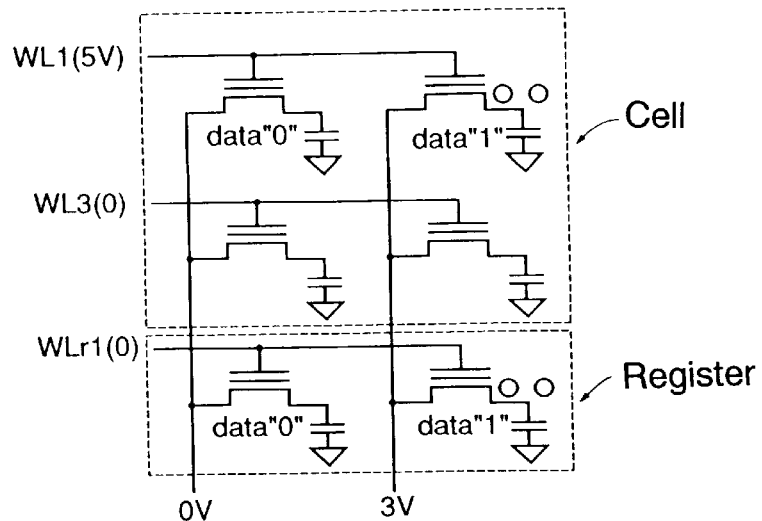
FIG. 8 is a view showing an equivalent circuit for explaining a state of the other storage operation in the non-volatile memory of the present invention.
Figure 9:
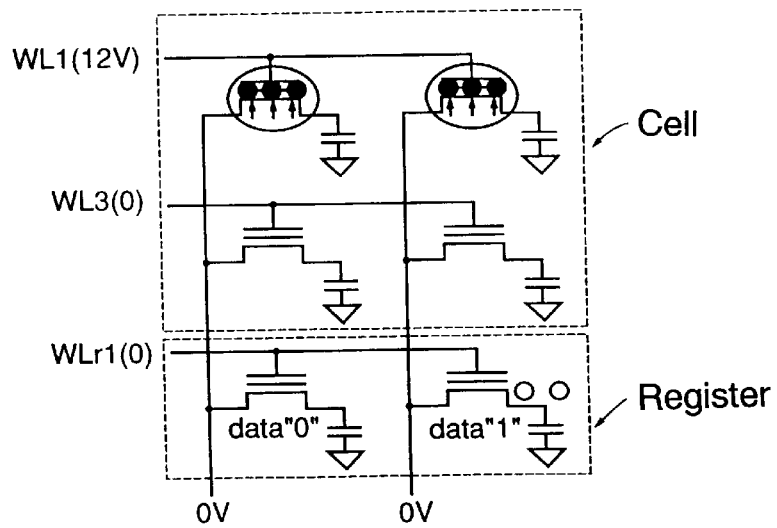
FIG. 9 is a view showing an equivalent circuit for explaining a state of the other storage operation in the non-volatile memory of the present invention.
Figure 10:
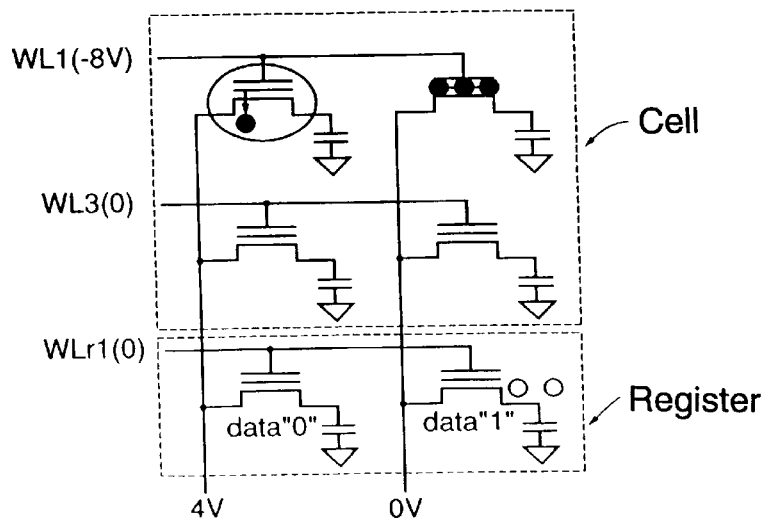
FIG. 10 is a view showing an equivalent circuit for explaining a state of the other storage operation in the non-volatile memory of the present invention.

The other storing operation is explained using equivalent circuits shown in FIG. 8 to FIG. 10.

First, the reading operation in an ordinary DRAM operation is carried out and the read data is stored in a register (a latching circuit) (FIG. 8). Although the register in FIG. 8 has the same structure as the memory cell, the register may be a known latching circuit obtained by combining two inverters.

Then, by applying a voltage of 12V to the selected word line and applying a voltage of 0V to all the bit lines, electrons are injected to all the memory transistors MT connected to the word line (FIG. 9).

Subsequently, a voltage of 4V is applied to the bit line when the latched data is "0", and a voltage of 0V is applied to the bit line when the latched data is "1". This allows the electrons to be drawn out only when the latched data is "0" (FIG. 10). At this time, a voltage of −8V is applied to the selected word line and a voltage of 0V is applied to the non-selected word line. A voltage of V$_{cc}$/2 (V) is applied to the plate electrode.

As regards the memory cells from which the data has not been stored, a refreshing operation is carried out by a known method (This operation is called a "burst refreshing"). After the above storing operation is finished, the power supply is turned off.

When the power supply is turned on again, the recalling/initializing operation (3) is carried out. This recalling/initializing operation is an operation in which the electric charge stored in the floating gate of the memory transistor MT is transferred to the capacitor. For that purpose, a series of operations such as writing, reading (verifying), latching, initializing and transferring are carried out (See FIGS. 11 to 16).

Figure 11:
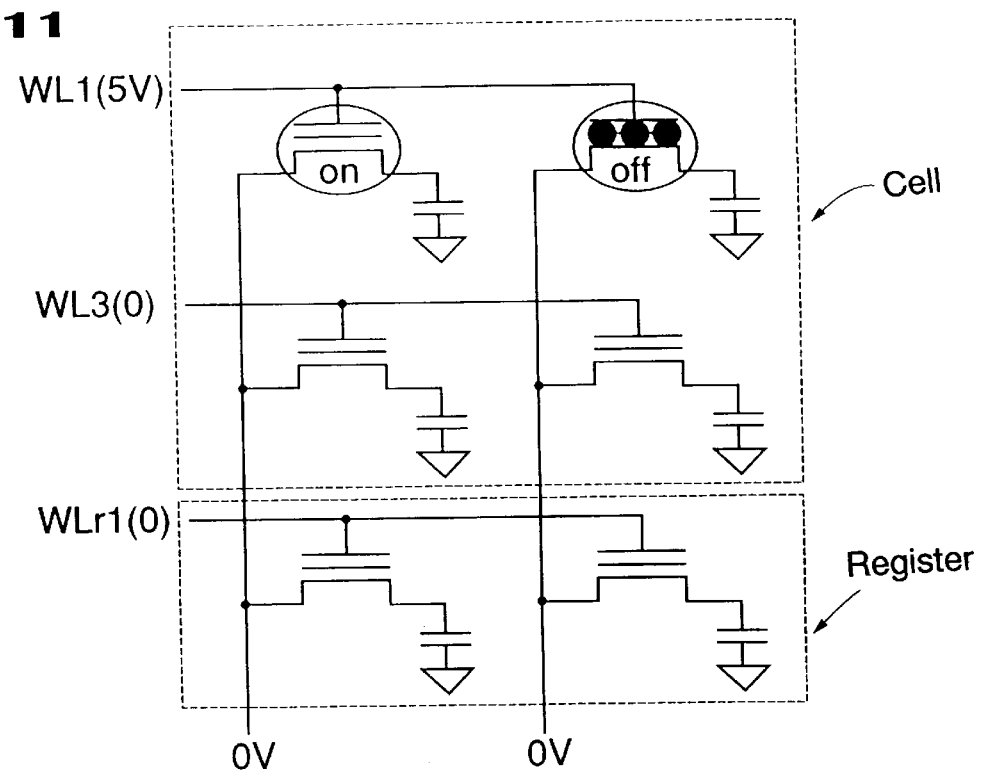
FIG. 11 is a view showing an equivalent circuit for explaining the writing process in the recalling/initializing operation in the non-volatile memory of the present invention.

First, the writing operation can be carried out by using an equivalent circuit shown in FIG. 11 and applying a voltage shown in Table 3. Namely, an electric potential of Vw1 satisfying the relation HVth>Vw1≧LVth is applied to the word line and a predetermined voltage such as 0V is applied to all the bit lines. This allows the memory transistor MT having a threshold voltage of HVth to be in an "OFF" state and the memory transistor MT having a threshold voltage of LVth to be in an "ON" state. Therefore, an electric potential of 0V is written only into the capacitor of the memory cell MT which is in the "ON" state (See FIG. 11).

TABLE 3

| recall/initialize | WL | | BL | CP |
|---|---|---|---|---|
| | selected | non selected | | |
| writing | HVth > Vw1 ≧ LVth (ex. 5V) | Vw1 < LVth (ex. 0V) | 0V | Vcc/2 |
| reading | HVth > Vw1 ≧ LVth | Vw1 < LVth | 1.5V | Vcc/2 |

Subsequently, the electric potential of the bit line is read by applying a voltage (for example 1.5V) different from that of writing to all the bit lines and applying to the word line an electric potential of Vw1 satisfying the relation HVth>Vw1≧LVth, as shown in Table 3. At this time, the electric potential of the bit line connected to the memory cell of the capacitor into which the voltage of 0V has been written in the previous writing operation (the memory cell whose memory transistor MT is in an "ON" state) decreases from 1.5V to 0V. On the other hand, the electric potential of the bit line connected to the memory cell of the capacitor into which the voltage of 0V has not been written in the previous writing operation (the memory cell whose memory transistor MT is in an "OFF" state) does not decrease but remain at 1.5V.

Figure 12:
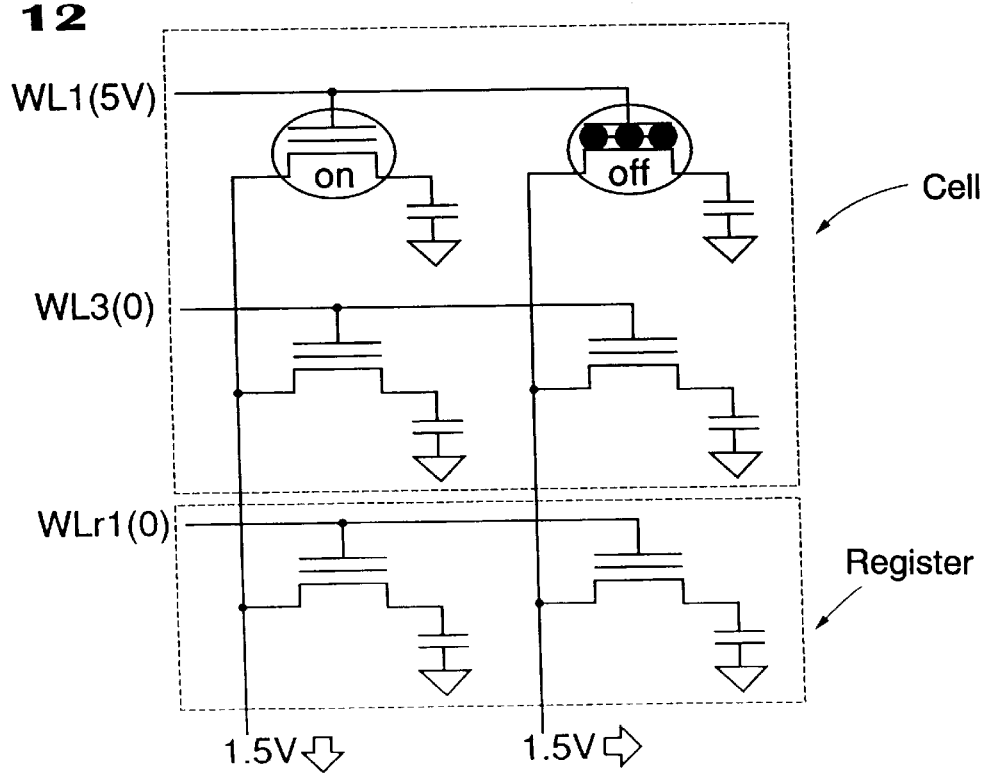
FIG. 12 is a view showing an equivalent circuit for explaining the reading process (verification) in the recalling/initializing operation in the non-volatile memory of the present invention.

Here, if the electric potential of the bit line at the time of writing and the electric potential of the bit line at the time of reading coincide with 0V, namely, if the memory transistor MT is in an "ON" state, the DRAM data is defined as "0". On the other hand, if the electric potential of the bit line at the time of writing does not coincide with the electric potential of the bit line at the time of reading, namely, if the memory transistor MT is in an "OFF" state, the DRAM data is defined as "1". The verification of whether the DRAM data in each memory cell is "1" or "0" is carried out in accordance with the above definition. It is to be noted that no electrons have been injected in the floating gate of the memory cell whose DRAM data is verified to be "1", whereas electrons have been injected in the floating gate of the memory cell whose DRAM data is verified to be "0" (FIG. 12).

Figure 13:
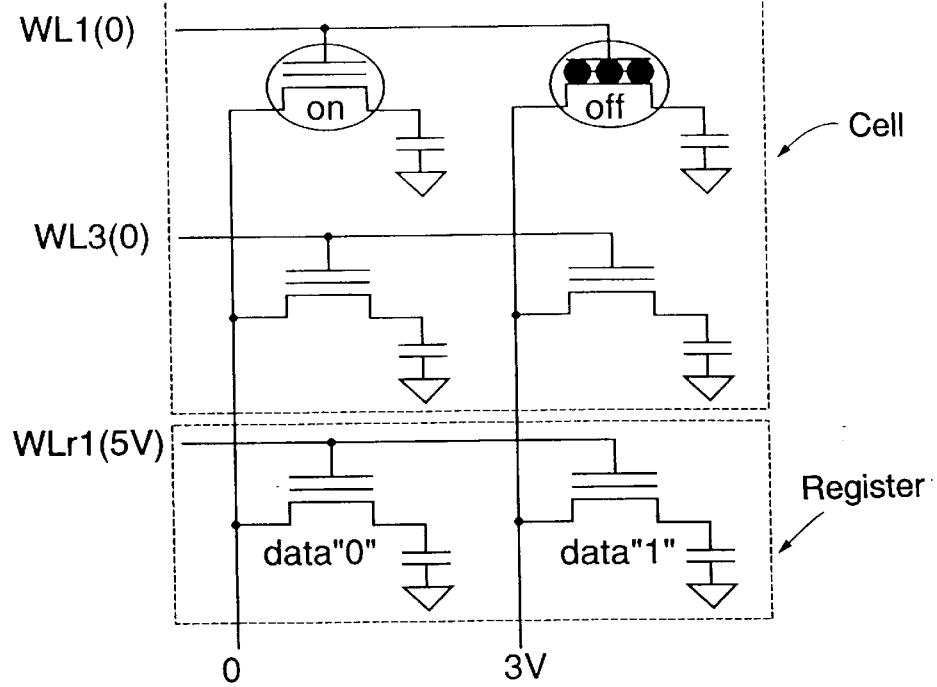
FIG. 13 is a view showing an equivalent circuit for explaining the latching process in the recalling/initializing operation in the non-volatile memory of the present invention.
Figure 14:
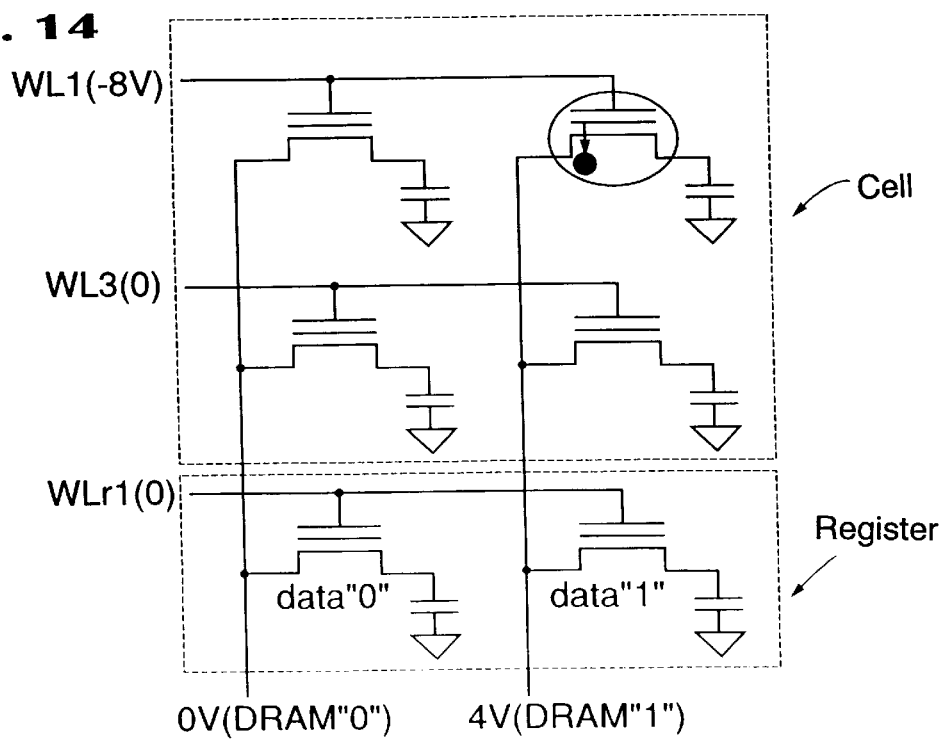
FIG. 14 is a view showing an equivalent circuit for explaining one initializing process in the recalling/initializing operation in the non-volatile memory of the present invention.

Subsequently, the verified data is latched. The latching operation is carried out in a known method, where the voltage of each bit line is read and stored into the latching circuit (FIG. 13).

Then, the electrons stored in the floating gates of the memory transistors MT are erased to allow the threshold voltages of all the memory transistors MT to be uniform (1 to 2V) (initialization). There are two ways to accomplish this. One method involves using an equivalent circuit shown in FIG. 14 and applying a voltage shown in Table 4.

TABLE 4

| recall/initialize | WL | | BL | | CP |
|---|---|---|---|---|---|
| | selected | non-selected | MT at HVth | MT at LVth | |
| initialize | −8V | 0V | 4V | 0V | Vcc/2 |

If electrons are stored in the floating gate of the memory transistor MT (namely, if the threshold voltage is HVth), a voltage of 4V is applied to the bit line, whereas if electrons are not stored in the floating gate of the memory transistor MT (namely, if the threshold voltage is LVth), a voltage of 0V is applied to the bit line. Since a high negative voltage of −8V is applied to the selected word line, an electric potential difference of 12V is generated between the word line and the bit line if electrons are stored in the floating gate, whereby electrons are drawn by FN tunnel current from the floating gate of the memory transistor MT into the drain diffusion layer to reduce the threshold voltage of MT to a voltage of, for example, about 1 to 2V (LVth). The drawing of electrons is repeated until the threshold voltage reaches a predetermined value (for example 2V). The verification of whether the threshold voltage has decreased to 2V is carried out by applying a voltage of 2V to the word line. If the memory transistor MT is in the "OFF" state, the drawing of electrons is carried out again. On the other hand, if no electrons are stored in the floating gate, a potential difference of only 8V is generated between the word line and the bit line, whereby no electrons are drawn from the floating gate of the memory transistor MT, whereby the threshold voltage of the memory transistor MT remain at a low value such as about 1 to 2V (LVth). This allows the threshold voltages of all the memory transistors MT to be uniform (1 to 2V).

The other method for initialization is now explained with reference to the equivalent circuits shown in FIGS. 15(a) and 15(b).

Figure 15A:
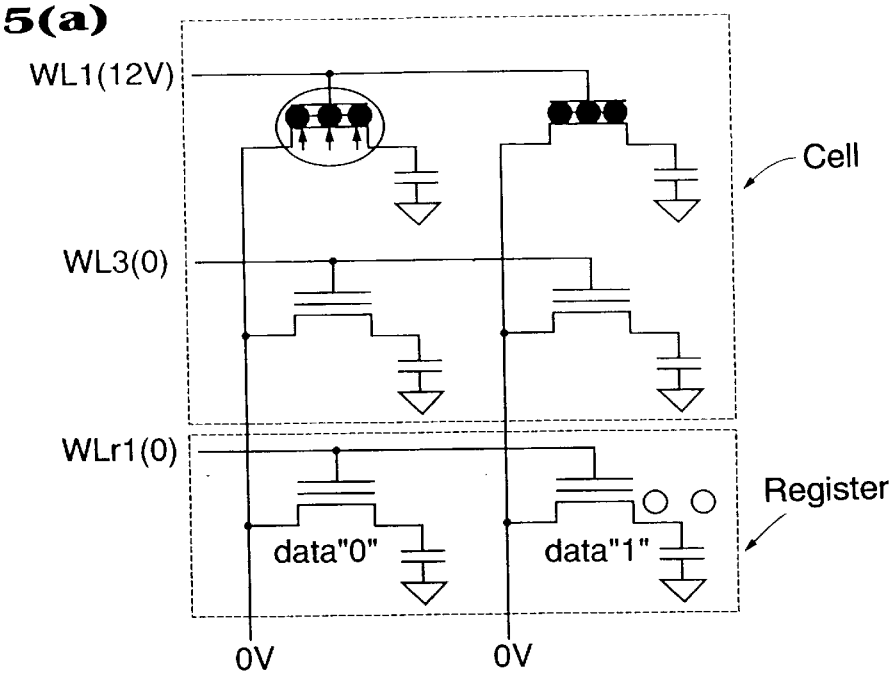
FIGS. 15(a) and 15(b) are views showing equivalent circuits for explaining the other initializing process in the recalling/initializing operation in the non-volatile memory of the present invention.

First, electrons are injected into the floating gates of all the memory transistors connected to the selected word line by applying a voltage of 12V to the selected word line and applying a voltage of 0V to all the bit lines irrespective of the latched data (FIG. 15(a)). Here, since the amount of electric charge stored in the floating gate is determined by the potential difference between the word line and the bit line, the injection of electrons is carried out until the electric charge in the floating gate of the memory transistor MT into which electrons have already been injected is approximately the same as the electric charge in the floating gate of the memory transistor MT into which no electrons have been injected. As a result, approximately the same threshold voltage is obtained.

Figure 15B:
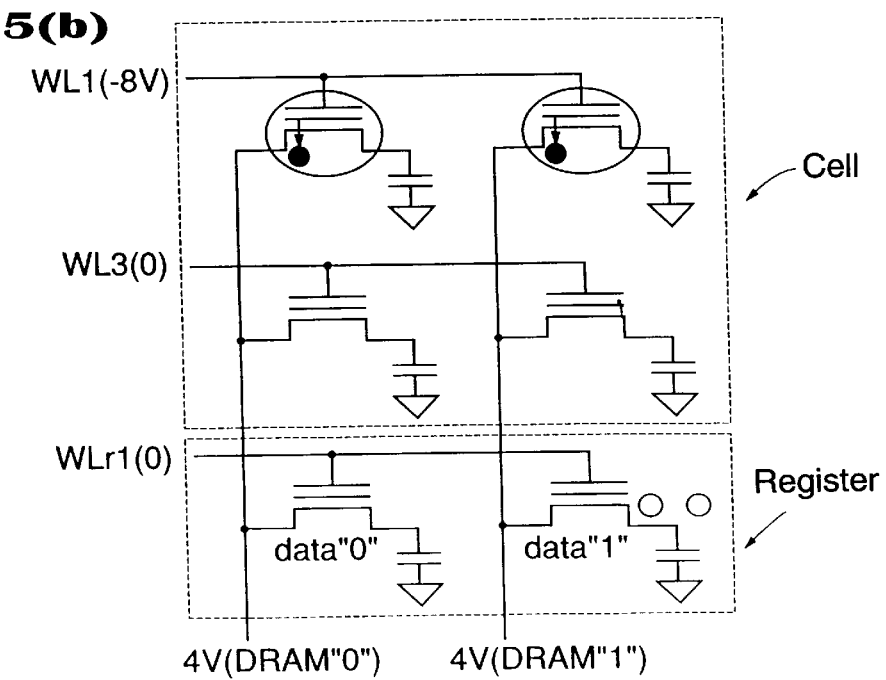

Then, the threshold voltages of all the memory transistors MT are made uniform (1V to 2V) by applying a voltage of −8V to the selected word line and applying a voltage of 4V to all the bit lines to draw electrons from the floating gates of all the memory transistors connected to the selected word line (FIG. 15(b)).

This method facilitates control of the voltage applied to the bit line because the voltage is not applied to the bit line in accordance with the latched data.

Figure 16:
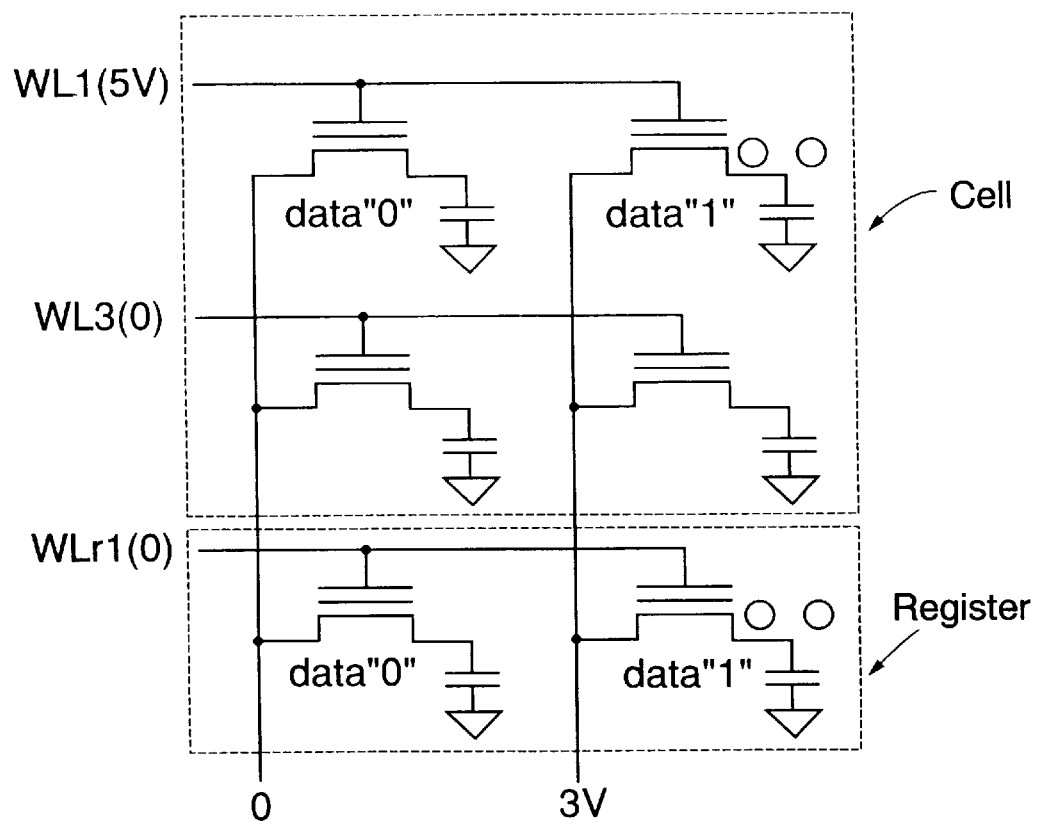
FIG. 16 is a view showing an equivalent circuit for explaining a transferring process in the recalling/initializing operation in the non-volatile memory of the present invention.

Finally, the data of either "1" or "0" is written into the capacitor according to the previously latched data. This allows the electric charge stored in the floating gate of the memory transistor to be transferred into the capacitor. Here, the writing of data into the capacitor can be carried out in the same manner as the writing of data in the above DRAM operation (FIG. 16).

The memory cells to which the recalling/initializing operation has been carried out are subjected to burst refreshing by a known method.

As described above, the non-volatile memory and the method of operating the same according to the present invention have the following advantages. Since one non-volatile memory includes one non-volatile memory transistor, one capacitor and an electron injecting/drawing means, it is possible to obtain a non-volatile memory having the functions of both the EEPROM and the DRAM which can continually rewrite the data at a high speed and can retain the rewritten data for a long time. Also, the number of elements in one memory and the area occupied by the memory can be as small as the conventional DRAM, enabling a large scale integration. Further, since the injection/drawing of electrons into the floating gate constituting the non-volatile memory is performed from the drain diffusion layer which is not connected to the capacitor, the potential difference between the control gate and the drain diffusion layer can be stably generated, thereby improving the characteristics of writing into the non-volatile memory transistor.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What I claim is:

1. A non-volatile memory comprising:
   at least one memory cell including one non-volatile memory transistor and one capacitor;
   the non-volatile memory transistor being composed of a first dielectric film, a floating gate, a second dielectric film and a control gate sequentially laminated on a semiconductor substrate, and source/drain diffusion layers formed in the semiconductor substrate, electrons being injected/drawn from the drain diffusion layer to the floating gate by use of a tunnel current;
   the capacitor being composed of a capacitor dielectric film sandwiched between two electrodes, a storage electrode and a plate electrode, the storage electrode being connected to the source diffusion layer of the non-volatile memory transistor; and
   an injecting/drawing means for injecting/drawing electrons from the drain diffusion layer to the floating gate by use of a tunnel current.

2. The non-volatile memory of claim 1, wherein the first dielectric film adjacent to the drain diffusion layer has a smaller thickness than the first dielectric film adjacent to the source diffusion layer.

3. The non-volatile memory of claim 1, wherein the first dielectric film has a uniform thickness.

4. The non-volatile memory of claim 1, wherein the injecting/drawing means is a means for injecting electrons into the floating gate in a writing operation and drawing electrons from the floating gate in an erasing operation.

5. The non-volatile memory of claim 1, wherein the injecting/drawing means is a means for drawing electrons from the floating gate in a writing operation and injecting electrons into the floating gate in an erasing operation.

6. A non-volatile memory comprising:
   at least one memory cell including one non-volatile memory transistor and one capacitor;
   the non-volatile memory transistor being composed of a first dielectric film, a floating gate, a second dielectric film and a control gate sequentially laminated on a semiconductor substrate, and source/drain diffusion layers formed in the semiconductor substrate;
   the capacitor being composed of a capacitor dielectric film sandwiched between two electrodes, a storage electrode and a plate electrode, the storage electrode being connected to the source diffusion layer of the non-volatile memory transistor; and
   an injecting/drawing means for injecting/drawing electrons from the drain diffusion layer to the floating gate by use of a tunnel current,
   further comprising a register having the same structure as the memory cell.

7. The non-volatile memory of claim 1, wherein the plurality of memory cells are arranged in a matrix configuration, the diffusion layer on the non-volatile transistor of each memory cell is connected to a bit line, and the control gate is connected to a word line.

8. A method of operating the non-volatile memory of any one of claims 1 to 6 having a plurality of memory cells arranged in a matrix configuration, a word line connected to the control gate of the non-volatile memory transistor, and a bit line connected to the drain diffusion layer of the non-volatile memory transistor, each capacitor having a predetermined data stored therein,
   in which a storing operation for controlling a threshold voltage of the non-volatile memory transistor comprises:
      applying a second voltage to the bit line using the electron injecting/drawing means to create a second potential difference for generating a tunnel current between the floating gate and at least the drain diffusion layer only when the data stored in the capacitor is a second data; and
      applying a first voltage to the bit line for inhibiting the generation of the tunnel current using the electron injecting/drawing means to create a first potential difference, which is smaller than the second potential difference, between the floating gate and at least the drain diffusion layer when the data stored in the capacitor is a first data.

9. A method of operating the non-volatile memory of any one of claims 1 to 6 having a plurality of memory cells arranged in a matrix configuration, a word line connected to the control gate of the non-volatile memory transistor, and a bit line connected to the drain diffusion layer of the non-volatile memory transistor, each capacitor having a predetermined data stored therein,
   in which a storing operation for controlling a threshold voltage of the non-volatile memory transistor comprises:
      latching the data stored in each capacitor;
      creating a potential difference to generate a tunnel current between the floating gate and at least the drain diffusion layer using the electron injecting/drawing means irrespective of the data stored in the capacitor to inject/draw electrons;
      applying a first voltage to the bit line using the electron injecting/drawing means to create a second potential difference for generating a tunnel current between the floating gate and at least the drain diffusion layer to draw/inject electrons only when the latched data is a first data; and
      applying a second voltage to the bit line for inhibiting the generation of the tunnel current using the electron injecting/drawing means to create a first potential difference, which is smaller than the second potential difference, between the floating gate and at least the drain diffusion layer when the latched data is a second data.

10. A method of operating the non-volatile memory of any one of claims 1 to 6 having a plurality of memory cells arranged in a matrix configuration, a word line connected to the control gate of the non-volatile memory transistor, and a bit line connected to the drain diffusion layer of the non-volatile memory transistor, each transistor having a predetermined data stored therein, in which a recalling/initializing operation comprises:

applying to the word line a voltage Vw1 between a threshold voltage of the transistor having the first data stored therein and a threshold voltage of the transistor having the second data stored therein and applying a predetermined voltage Vb1 to the bit line to write a voltage Vb1 only into the capacitor of the transistor turned on;

applying the voltage Vw1 to the word line, applying to the bit line a voltage Vb2 which is different from the voltage Vb1, detecting a change in the voltage Vb2 on the bit line, verifying the data to be the first data when the detected voltage is not coincident with the voltage Vb2 and verifying the data to be the second data when the detected voltage is coincident with the voltage Vb2, and latching the data;

allowing the thresh-old voltages of all the non-volatile memory transistors to be uniform by applying a first voltage to the bit line using the electron injecting/drawing means to create a second potential difference for generating a tunnel current between the floating gate and at least the drain diffusion layer only when the second data is stored in the transistor, and by applying a second voltage to the bit line for inhibiting the generation of the tunnel current using the electron injecting/drawing means to create a first potential difference, which is smaller than the second potential difference, between the floating gate and at least the drain diffusion layer when the threshold voltage of the transistor corresponds to the first data; and storing the latched first and second data respectively into the capacitors.

11. A method of operating the non-volatile memory of any one of claims 1 to 6 having a plurality of memory cells arranged in a matrix configuration, a word line connected to the control gate of the non-volatile memory transistor, and a bit line connected to the drain diffusion layer of the non-volatile memory transistor, each transistor having a predetermined data stored therein, in which a recalling/initializing operation comprises:

applying to the word line a voltage Vw1 between a threshold voltage of the transistor having the first data stored therein and a threshold voltage of the transistor having the second data stored therein and applying a predetermined voltage Vb1 to the bit line to write a voltage Vb1 only into the capacitor of the transistor turned on;

applying the voltage Vw1 to the word line, applying to the bit line a voltage Vb2 which is different from the voltage Vb1, detecting a change in the voltage Vb2 on the bit line, verifying the data to be the first data when the detected voltage is not coincident with the voltage Vb2 and verifying the data to be the second data when the detected voltage is coincident with the voltage Vb2, and latching the data;

applying a second voltage to the bit line using the electron injecting/drawing means to create a potential difference for generating a tunnel current between the floating gate and at least the drain diffusion layer for injecting/drawing the electrons to allow the threshold voltages of all the transistors connected to a selected word line to be higher than the threshold voltage of the transistor having the first data stored therein irrespective of the latched data;

applying a first voltage to the bit line using the electron injecting/drawing means to create a potential difference for generating a tunnel current between the floating gate and at least the drain diffusion layer for injecting/drawing the electrons to allow the threshold voltages of all the transistors connected to the selected word line to be uniform; and storing the latched first and second data respectively into the capacitors.

12. A non-volatile memory comprising:

at least one memory cell including one non-volatile memory transistor and one capacitor;

the non-volatile memory transistor being composed of a first dielectric film, a floating gate, a second dielectric film and a control gate sequentially laminated on a semiconductor substrate, and source/drain diffusion layers formed in the semiconductor substrate;

the capacitor being composed of a capacitor dielectric film sandwiched between two electrodes, a storage electrode and a plate electrode, the storage electrode being connected to the source diffusion layer of the non-volatile memory transistor; and an injecting/drawing means for injecting/drawing electrons from the drain diffusion layer to the floating gate by use of a tunnel current, wherein the at least one memory cell stores data in the floating gate of the non-volatile memory transistor when a power supply is off, and stores data in the capacitor by a DRAM (Dynamic Random Access Memory) operation when the power supply is on.

13. The non-volatile memory of claim 12, wherein the first dielectric film adjacent to the drain diffusion layer has a smaller thickness than the first dielectric film adjacent to the source diffusion layer.

14. The non-volatile memory of claim 12, wherein the first dielectric film has a uniform thickness.

15. The non-volatile memory of claim 12, wherein the injecting/drawing means is a means for injecting electrons into the floating gate in a writing operation and drawing electrons from the floating gate in an erasing operation.

16. The non-volatile memory of claim 12, wherein the injecting/drawing means is a means for drawing electrons from the floating gate in a writing operation and injecting electrons into the floating gate in an erasing operation.

17. The non-volatile memory of claim 11, further comprising a register having the same structure as the memory cell.

18. A method of operating the non-volatile memory of any one of claims 12, or 13–17 inclusive, having a plurality of memory cells arranged in a matrix configuration, a word line connected to the control gate of the non-volatile memory transistor, and a bit line connected to the drain diffusion layer of the non-volatile memory transistor, each capacitor having a predetermined data stored therein, in which a storing operation for controlling a threshold voltage of the non-volatile memory transistor comprises:

applying a second voltage to the bit line using the electron injecting/drawing means to create a second potential difference for generating a tunnel current between the floating gate and at least the drain diffusion layer only when the data stored in the capacitor is a second data; and applying a first voltage to the bit line for inhibiting the generation of the tunnel current using the electron injecting/drawing means to create a first potential difference, which is smaller than the second potential difference, between the floating gate and at least the drain diffusion layer when the data stored in the capacitor is a first data.

19. A method of operating the non-volatile memory of any one of claims 12, or 13–17 inclusive, having a plurality of memory cells arranged in a matrix configuration, a word line connected to the control gate of the non-volatile memory transistor, and a bit line connected to the drain diffusion layer of the non-volatile memory transistor, each capacitor having a predetermined data stored therein, in which a storing operation for controlling a threshold voltage of the non-volatile memory transistor comprises:

latching the data stored in each capacitor;

creating a potential difference to generate a tunnel current between the floating gate and at least the drain diffusion layer using the electron injecting/drawing means irrespective of the data stored in the capacitor to inject/draw electrons;

applying a first voltage to the bit line using the electron injecting/drawing means to create a second potential difference for generating a tunnel current between the floating gate and at least the drain diffusion layer to draw/inject electrons only when the latched data is a first data; and applying a second voltage to the bit line for inhibiting the generation of the tunnel current using the electron injecting/drawing means to create a first potential difference, which is smaller than the second potential difference, between the floating gate and at least the drain diffusion layer when the latched data is a second data.

20. A method of operating the non-volatile memory of any one of claims 12, or 13–17 inclusive, having a plurality of memory cells arranged in a matrix configuration, a word line connected to the control gate of the non-volatile memory transistor, and a bit line connected to the drain diffusion layer of the non-volatile memory transistor, each transistor having a predetermined data stored therein, in which a recalling/initializing operation comprises:

applying to the word line a voltage Vw1 between a threshold voltage of the transistor having the first data stored therein and a threshold voltage of the transistor having the second data stored therein and applying a predetermined voltage Vb1 to the bit line to write a voltage Vb1 only into the capacitor of the transistor turned on;

applying the voltage Vw1 to the word line, applying to the bit line a voltage Vb2 which is different from the voltage Vb1, detecting a change in the voltage Vb2 on the bit line, verifying the data to be the first data when the detected voltage is not coincident with the voltage Vb2 and verifying the data to be the second data when the detected voltage is coincident with the voltage Vb2, and latching the data;

allowing the threshold voltages of all the non-volatile memory transistors to be uniform by applying a first voltage to the bit line using the electron injecting/drawing means to create a second potential difference for generating a tunnel current between the floating gate and at least the drain diffusion layer only when the second data is stored in the transistor, and by applying a second voltage to the bit line for inhibiting the generation of the tunnel current using the electron injecting/drawing means to create a first potential difference, which is smaller than the second potential difference, between the floating gate and at least the drain diffusion layer when the threshold voltage of the transistor corresponds to the first data; and storing the latched first and second data respectively into the capacitors.

21. A method of operating the non-volatile memory of any one of claims 11, or 13–17 inclusive, having a plurality of memory cells arranged in a matrix configuration, a word line connected to the control gate of the non-volatile memory transistor, and a bit line connected to the drain diffusion layer of the non-volatile memory transistor, each transistor having a predetermined data stored therein, in which a recalling/initializing operation comprises:

applying to the word line a voltage Vw1 between a threshold voltage of the transistor having the first data stored therein and a threshold voltage of the transistor having the second data stored therein and applying a predetermined voltage Vb1 to the bit line to write a voltage Vb1 only into the capacitor of the transistor turned on;

applying the voltage Vw1 to the word line, applying to the bit line a voltage Vb2 which is different from the voltage Vb1, detecting a change in the voltage Vb2 on the bit line, verifying the data to be the first data when the detected voltage is not coincident with the voltage Vb2 and verifying the data to be the second data when the detected voltage is coincident with the voltage Vb2, and latching the data;

applying a second voltage to the bit line using the electron injecting/drawing means to create a potential difference for generating a tunnel current between the floating gate and at least the drain diffusion layer for injecting/drawing the electrons to allow the threshold voltages of all the transistors connected to a selected word line to be higher than the threshold voltage of the transistor having the first data stored therein irrespective of the latched data;

applying a first voltage to the bit line using the electron injecting/drawing means to create a potential difference for generating a tunnel current between the floating gate and at least the drain diffusion layer for injecting/drawing the electrons to allow the threshold voltages of all the transistors connected to the selected word line to be uniform; and storing the latched first and second data respectively into the capacitors.

22. A non-volatile memory comprising:

at least one memory cell including one non-volatile memory transistor and one capacitor;

the non-volatile memory transistor being composed of a first dielectric film, a floating gate, a second dielectric film and a control gate sequentially laminated on a semiconductor substrate, and source/drain diffusion layers formed in the semiconductor substrate;

the capacitor being composed of a capacitor dielectric film sandwiched between two electrodes, one of the electrodes being connected to the source diffusion layer of the non volatile memory transistor;

an injecting/drawing means for injecting/drawing electrons from the drain diffusion layer to the floating gate by use of a tunnel current; and a register having the same structure as the memory cell.

23. The non-volatile memory of claim 22, wherein the first dielectric film adjacent to the drain diffusion layer has a smaller thickness than the first dielectric film adjacent to the source diffusion layer.

24. The non-volatile memory of claim 22, wherein the first dielectric film has a uniform thickness.

25. The non-volatile memory of claim 22, wherein the injecting/drawing means is a means for injecting electrons into the floating gate in a writing operation and drawing electrons from the floating gate in an erasing operation.

26. The non-volatile memory of claim 22, wherein the injecting/drawing means is a means for drawing electrons from the floating gate in a writing operation and injecting electrons into the floating gate in an erasing operation.

27. The non-volatile memory of claim 22, wherein the at least one memory cell stores data in the floating gate of the non-volatile memory transistor when a power supply is off, and stores data in the capacitor by a DRAM (Dynamic Random Access Memory) operation when the power supply is on.

28. A method of operating the non-volatile memory of any one of claims 22 to 27 having a plurality of memory cells arranged in a matrix configuration, a word line connected to the control gate of the non-volatile memory transistor, and a bit line connected to the drain diffusion layer of the non-volatile memory transistor, each capacitor having a predetermined data stored therein, in which a storing operation for controlling a threshold voltage of the non-volatile memory transistor comprises:

applying a second voltage to the bit line using the electron injecting/drawing means to create a second potential difference for generating a tunnel current between the floating gate and at least the drain diffusion layer only when the data stored in the capacitor is a second data; and applying a first voltage to the bit line for inhibiting the generation of the tunnel current using the electron injecting/drawing means to create a first potential difference, which is smaller than the second potential difference, between the floating gate and at least the drain diffusion layer when the data stored in the capacitor is a first data.

29. A method of operating the non-volatile memory of any one of claims 22 to 27 having a plurality of memory cells arranged in a matrix configuration, a word line connected to the control gate of the non-volatile memory transistor, and a bit line connected to the drain diffusion layer of the non-volatile memory transistor, each capacitor having a predetermined data stored therein, in which a storing operation for controlling a threshold voltage of the non-volatile memory transistor comprises:

latching the data stored in each capacitor;

creating a potential difference to generate a tunnel current between the floating gate and at least the drain diffusion layer using the electron injecting/drawing means irrespective of the data stored in the capacitor to inject/draw electrons;

applying a first voltage to the bit line using the electron injecting/drawing means to create a second potential difference for generating a tunnel current between the floating gate and at least the drain diffusion layer to draw/inject electrons only when the latched data is a first data; and applying a second voltage to the bit line for inhibiting the generation of the tunnel current using the electron injecting/drawing means to create a first potential difference, which is smaller than the second potential difference, between the floating gate and at least the drain diffusion layer when the latched data is a second data.

30. A method of operating the non-volatile memory of any one of claims 22 to 27 having a plurality of memory cells arranged in a matrix configuration, a word line connected to the control gate of the non-volatile memory transistor, and a bit line connected to the drain diffusion layer of the non-volatile memory transistor, each transistor having a predetermined data stored therein, in which a recalling/initializing operation comprises:

applying to the word line a voltage Vw1 between a threshold voltage of the transistor having the first data stored therein and a threshold voltage of the transistor having the second data stored therein and applying a predetermined voltage Vb1 to the bit line to write a voltage Vb1 only into the capacitor of the transistor turned on;

applying the voltage Vw1 to the word line, applying to the bit line a voltage Vb2 which is different from the voltage Vb1, detecting a change in the voltage Vb2 on the bit line, verifying the data to be the first data when the detected voltage is not coincident with the voltage Vb2 and verifying the data to be the second data when the detected voltage is coincident with the voltage Vb2, and latching the data;

allowing the threshold voltages of all the non-volatile memory transistors to be uniform by applying a first voltage to the bit line using the electron injecting/drawing means to create a second potential difference for generating a tunnel current between the floating gate and at least the drain diffusion layer only when the second data is stored in the transistor, and by applying a second voltage to the bit line for inhibiting the generation of the tunnel current using the electron injecting/drawing means to create a first potential difference, which is smaller than the second potential difference, between the floating gate and at least the drain diffusion layer when the threshold voltage of the transistor corresponds to the first data; and storing the latched first and second data respectively into the capacitors.

31. A method of operating the non-volatile memory of any one of claims 22 to 27 having a plurality of memory cells arranged in a matrix configuration, a word line connected to the control gate of the non-volatile memory transistor, and a bit line connected to the drain diffusion layer of the non-volatile memory transistor, each transistor having a predetermined data stored therein, in which a recalling/initializing operation comprises:

applying to the word line a voltage Vw1 between a threshold voltage of the transistor having the first data stored therein and a threshold voltage of the transistor having the second data stored therein and applying a predetermined voltage Vb1 to the bit line to write a voltage Vb1 only into the capacitor of the transistor turned on; applying the voltage Vw1 to the word line, applying to the bit line a voltage Vb2 which is different from the voltage Vb1, detecting a change in the voltage Vb2 on the bit line, verifying the data to be the first data when the detected voltage is not coincident with the voltage Vb2 and verifying the data to be the second data when the detected voltage is coincident with the voltage Vb2, and latching the data;

applying a second voltage to the bit line using the electron injecting/drawing means to create a potential difference for generating a tunnel current between the floating gate and at least the drain diffusion layer for injecting/drawing the electrons to allow the threshold voltages of all the transistors connected to a selected word line to be higher than the threshold voltage of the transistor having the first data stored therein irrespective of the latched data;

applying a first voltage to the bit line using the electron injecting/drawing means to create a potential difference for generating a tunnel current between the floating gate and at least the drain diffusion layer for injecting/drawing the electrons to allow the threshold voltages of all the transistors connected to the selected word line to be uniform; and storing the latched first and second data respectively into the capacitors.

* * * * *